United States Patent
Yamakawa et al.

(10) Patent No.: US 11,909,299 B2
(45) Date of Patent: Feb. 20, 2024

(54) POWER CONVERTING APPARATUS, MOTOR DRIVING APPARATUS, AND AIR CONDITIONER

(71) Applicant: Mitsubishi Electric Corporation, Tokyo (JP)

(72) Inventors: Takashi Yamakawa, Tokyo (JP); Koichi Arisawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 627 days.

(21) Appl. No.: 17/057,238

(22) PCT Filed: Jul. 19, 2018

(86) PCT No.: PCT/JP2018/027175
§ 371 (c)(1),
(2) Date: Nov. 20, 2020

(87) PCT Pub. No.: WO2020/017008
PCT Pub. Date: Jan. 23, 2020

(65) Prior Publication Data
US 2021/0167695 A1     Jun. 3, 2021

(51) Int. Cl.
*H02M 7/219*     (2006.01)
*H02M 1/00*      (2006.01)

(52) U.S. Cl.
CPC ......... *H02M 1/0006* (2021.05); *H02M 7/219* (2013.01)

(58) Field of Classification Search
CPC ............................. H02M 7/219; H02M 1/0006
See application file for complete search history.

(56) References Cited

U.S. PATENT DOCUMENTS

2005/0116744 A1    6/2005   Iwagami et al.
2009/0180228 A1    7/2009   Iwagami et al.
(Continued)

FOREIGN PATENT DOCUMENTS

JP        2005-160268 A    6/2005
JP        2009-219269 A    9/2009
(Continued)

OTHER PUBLICATIONS

Office Action dated Jun. 21, 2022 issued in corresponding Korean Patent Application No. 10-2021-7001042 (and English translation).
(Continued)

*Primary Examiner* — Alex Torres-Rivera
(74) *Attorney, Agent, or Firm* — POSZ LAW GROUP, PLC

(57) ABSTRACT

A power converting apparatus includes a first arm including a switching element and a switching element connected in series, a second arm connected in parallel with the first arm and including a switching element and a switching element connected in series, a reactor having one end connected to the switching element and the switching element and the other end connected to a single-phase alternating-current power supply, and a smoothing capacitor connected in parallel with the first arm and the second arm. The power converting apparatus includes a driving circuit driving the switching element, a bootstrap circuit, and a diode adjusting a power supply voltage, wherein a first voltage at which a forward current starts to flow to the diode is lower than a second voltage at which a forward current starts to flow in a body diode formed in the second switching element.

22 Claims, 20 Drawing Sheets

(56) References Cited

U.S. PATENT DOCUMENTS

| | | | | |
|---|---|---|---|---|
| 2013/0257390 A1* | 10/2013 | Jin | ...................... | H02M 1/4233 |
| | | | | 323/205 |
| 2015/0117076 A1* | 4/2015 | Zhang | ................... | H02M 7/219 |
| | | | | 363/127 |
| 2016/0126168 A1 | 5/2016 | Araki et al. | | |
| 2016/0181944 A1* | 6/2016 | James | ...................... | H02J 3/381 |
| | | | | 363/127 |
| 2017/0230046 A1 | 8/2017 | De Rooij et al. | | |
| 2017/0302194 A1* | 10/2017 | Zhang | ................... | H02M 7/219 |
| 2018/0159529 A1* | 6/2018 | Reusch | ............... | H01L 29/2003 |
| 2019/0115861 A1* | 4/2019 | Ogura | ................. | H02M 5/4585 |
| 2020/0168409 A1 | 5/2020 | Yamakawa et al. | | |
| 2020/0343811 A1* | 10/2020 | Xiang | ................. | H02M 1/4225 |
| 2020/0382016 A1* | 12/2020 | Wen | ...................... | H02M 1/081 |

FOREIGN PATENT DOCUMENTS

| | | |
|---|---|---|
| JP | 2014-099946 A | 5/2014 |
| JP | 2015-012640 A | 1/2015 |
| JP | 2015-061322 A | 3/2015 |
| JP | 2016-220378 A | 12/2016 |
| JP | 2016-226093 A | 12/2016 |
| JP | 2018-068028 A | 4/2018 |
| WO | 2015/008333 A1 | 1/2015 |
| WO | 2018/073874 A1 | 4/2018 |
| WO | 2018/073875 A1 | 4/2018 |
| WO | 2019/026293 A1 | 2/2019 |

OTHER PUBLICATIONS

Indian Office Action dated Jun. 2, 2021, issued in corresponding Indian Patent Application No. 202027052960 (and English Machine Translation).

Office Action dated Sep. 27, 2022 for the corresponding European Patent Application No. 18926387.4.

International Search Report of the International Searching Authority dated Sep. 11, 2018 for the corresponding international application No. PCT/JP2018/027175 (and English translation).

Extended European Search Report dated Jun. 15, 2021 issued in corresponding European patent application No. 18926387.4.

Japanese Office Action dated Apr. 27, 2021, issued in corresponding Japanese Patent Application No. 2020-530827 (and English Machine Translation).

Office Action dated Oct. 19, 2023 in corresponding Chinese Patent Application No. 201880095574.8 (and English translation).

Office Action dated Nov. 29, 2023 issued in corresponding European Patent Application No. 18926387.4.

Office Action dated Dec. 26, 2023 issued in corresponding IN patent application No. 202027052960.

* cited by examiner

POWER CONVERTING APPARATUS, MOTOR DRIVING APPARATUS, AND AIR CONDITIONER

CROSS REFERENCE TO RELATED APPLICATION

This application is a U.S. national stage application of PCT/JP2018/027175 filed on Jul. 19, 2018, the contents of which are incorporated herein by reference.

FIELD

The present invention relates to a power converting apparatus that converts an alternating-current power supplied from an alternating-current power supply into a direct-current power, and a motor driving apparatus and an air conditioner that include the power converting apparatus.

BACKGROUND

A power supply current that is a current supplied from a power supply includes a harmonic current. The harmonic current is a frequency component with a frequency higher than the frequency of a fundamental wave. In order to reduce failures caused by a harmonic current, international restrictions are imposed on electronic devices generating harmonic currents. In compliance with the restrictions, measures for reducing harmonic currents included in power supply currents by chopping of an alternating current (AC) or a direct current (DC) are taken in converters.

Among such converters, bridgeless converters in which a rectifier circuit is constituted by switching elements have been actively examined as a technology for reducing losses by using the AC chopping technology. A direct-current power supply device, which is an example of the bridgeless converters, described in Patent Literature 1 includes a first arm constituted by an upper diode and a lower diode connected in series to each other, a second arm constituted by an upper switching element and a lower switching element connected in series to each other, and a direct-current power supply for driving the second arm. The direct-current power supply device described in Patent Literature 1 also includes a first drive circuit that uses a voltage output from the direct-current power supply as a power supply voltage to generate a driving signal for driving the lower switching element of the second arm, a bootstrap circuit that uses the voltage output from the direct-current power supply to generate a voltage for driving the upper switching element of the second arm, and a second drive circuit that uses the voltage output from the bootstrap circuit as a power supply voltage to generate a driving signal for driving the upper switching element of the second arm. Hereinafter, the drive circuits will be referred to as driving circuits. In addition, hereinafter, the upper switching element of the second arm will be simply referred to as an upper switching element, and the lower switching element of the second arm will be simply referred to as a lower switching element.

The bootstrap circuit is constituted by a resistor, a diode, and a capacitor. In the technology described in Patent Literature 1, when the lower switching element is turned ON, a closed circuit is formed by the direct-current power supply, the bootstrap circuit, and the lower switching element, and the capacitor of the bootstrap circuit is thus charged by the direct-current power supply. In this process, in addition to the voltage of the direct-current power supply, a forward voltage of the body diode formed in the lower switching element of the second arm is also applied to the capacitor. The capacitor voltage of the charged capacitor is then used as the power supply voltage for the second driving circuit, and a driving signal for driving the upper switching element is thus generated in the second driving circuit.

CITATION LIST

Patent Literature

Patent Literature 1: Japanese Patent Application Laid-open No. 2016-220378

SUMMARY

Technical Problem

In a case where metal-oxide-semiconductor field-effect transistors (MOSFETs) made of wide band gap (WBG) semiconductors, for example, are used for the switching elements, a potential barrier of a p-n junction of a WBG semiconductor is higher than that of a silicon (Si) semiconductor. Thus, a voltage at which a forward current starts to flow in a body diode formed in a WBG MOSFET is a value higher than a voltage at which a forward current starts to flow in a body diode formed in a Si switching element. It can thus be said that the forward current-forward voltage characteristics of a body diode formed in a WBG MOSFET is inferior to the forward current-forward voltage characteristics of a body diode formed in a Si switching element. In a case where a switching element in which a voltage at which a forward current starts to flows in a body diode is relatively high as described above is used for a lower switching element of Patent Literature 1, the capacitor voltage of the capacitor of the bootstrap circuit, that is, the power supply voltage for the driving circuits may be higher than a rated voltage of a driving circuit. When a power supply voltage higher than the rated voltage of a driving circuit is applied to the driving circuit in this manner, there is a problem in that a withstand voltage of the driving circuit decreases. The withstand voltage used herein is a voltage that can be applied to a driving circuit for a prescribed time without causing breakdown of the driving circuit. In addition, because the value of a driving signal generated by a driving circuit becomes larger as the power supply voltage for the driving circuit is higher, there is a problem in that a short circuit withstand of the upper switching element decreases. The short circuit withstand is defined as a time from when a short-circuit current starts to flow into the upper switching element until the upper switching element is damaged.

The present invention has been made in view of the above, and an object thereof is to provide a power converting apparatus capable of improving the reliability by preventing or reducing an increase in a power supply voltage for driving circuits for switching elements.

Solution to Problem

To solve the aforementioned problems and achieve the object, a power converting apparatus according to the present invention is a power converting apparatus for converting an alternating-current power supplied from an alternating-current power supply into a direct-current power, and includes: a first line and a second line, each of the first line and the second line being connected to the alternating-current power supply; and a first reactor disposed on the first line. The power converting apparatus includes: a first arm including a first switching element, a second switching element, and a third line having a first connection point, the first switching element being connected to the second switching element in series by the third line, the first connection point being connected to the first reactor by the first line. The power converting apparatus includes: a second arm connected in parallel with the first arm and including a third switching element, a fourth switching element, and a fourth line having a second connection point, the third switching element being connected to the fourth switching element in series by the fourth line, the second connection point being connected to the alternating-current power supply by the second line. The power converting apparatus includes: a first capacitor connected in parallel with the second arm; a first driving circuit outputting a first driving signal for driving the first switching element; a bootstrap circuit including a second capacitor, the second capacitor applying a power supply voltage for the first driving circuit to the first driving circuit; and a diode adjusting the power supply voltage, wherein a first voltage is lower than a second voltage, the first voltage being a voltage at which a forward current starts to flow in the diode, the second voltage being a voltage at which a forward current starts to flow in a body diode formed in the second switching element.

Advantageous Effects of Invention

The power converting apparatus according to the present invention produces an effect of being capable of improving the reliability by preventing or reducing an increase in the power supply voltage for the driving circuits for the switching elements.

DESCRIPTION OF EMBODIMENTS

A power converting apparatus, a motor driving apparatus, and an air conditioner according to certain embodiments of the present invention will be described in detail below with reference to the drawings. Note that the present invention is not limited to the embodiments.

First Embodiment

Figure 1:
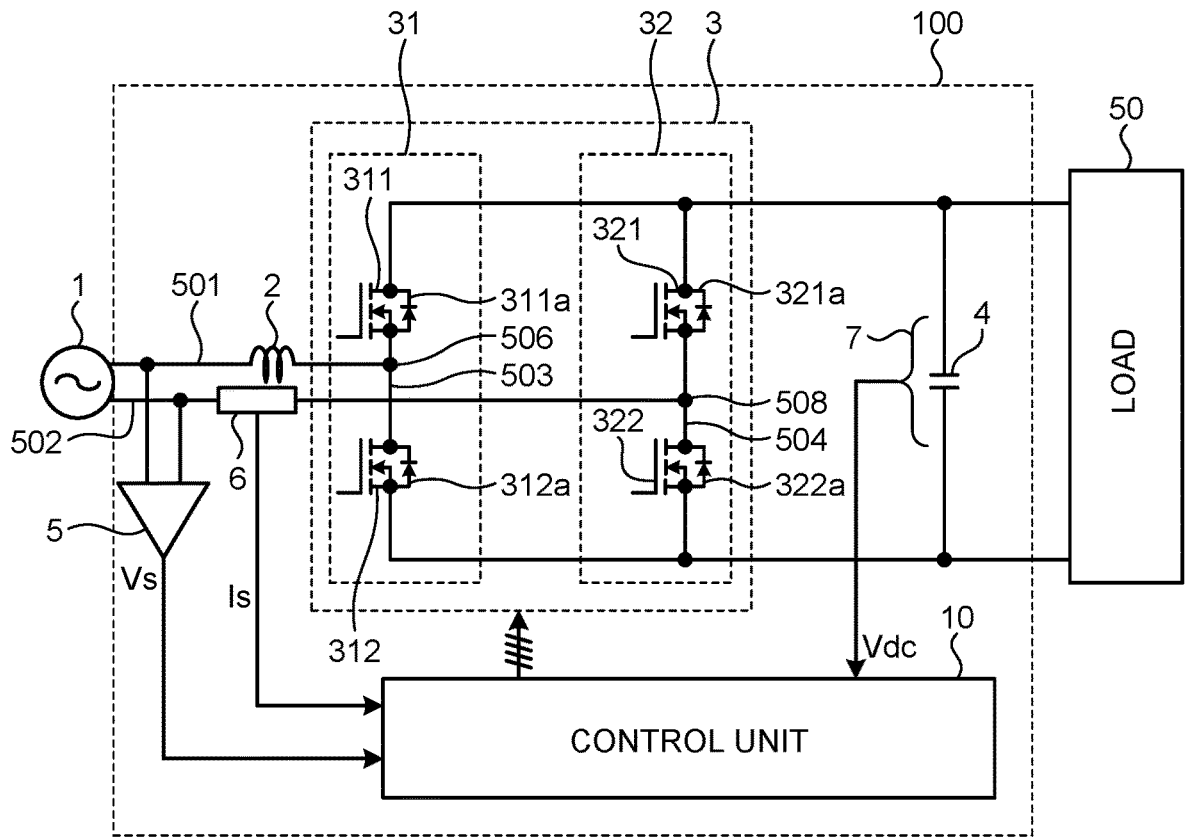
FIG. 1 is a diagram illustrating an example of a configuration of a power converting apparatus according to a first embodiment.

FIG. 1 is a diagram illustrating an example of a configuration of a power converting apparatus according to a first embodiment. A power converting apparatus 100 according to the first embodiment is a power supply device having an AC-DC converting function for converting an alternating-current power supplied form a single-phase alternating-current power supply 1 into a direct-current power and applying the direct-current power to a load 50. Hereinafter, the single-phase alternating-current power supply 1 may simply be referred to as an alternating-current power supply 1. As illustrated in FIG. 1, the power converting apparatus 100 includes a reactor 2, which is a first reactor, a bridge circuit 3, a smoothing capacitor 4, which is a first capacitor, a power supply voltage detecting unit 5, a power supply current detecting unit 6, a bus voltage detecting unit 7, and a control unit 10.

The bridge circuit 3 includes a first arm 31, which is a first circuit, and a second arm 32, which is a second circuit. The first arm 31 includes a switching element 311 and a switching element 312, which are connected in series. A body diode 311a is formed in the switching element 311. The body diode 311a is connected in parallel between a drain and a source of the switching element 311. A body diode 312a is formed in the switching element 312. The body diode 312a is connected in parallel between a drain and a source of the switching element 312. The body diodes 311a and 312a are each used as a freewheeling diode.

The second arm 32 incudes a switching element 321 and a switching element 322, which are connected in series. The second arm 32 is connected in parallel with the first arm 31. A body diode 321a is formed in the switching element 321. The body diode 321a is connected in parallel between a drain and a source of the switching element 321. A body diode 322a is formed in the switching element 322. The body diode 322a is connected in parallel between a drain and a source of the switching element 322. The body diodes 321a and 322a are each used as a freewheeling diode.

Specifically, the power converting apparatus 100 incudes a first line 501 and a second line 502, which are each connected to the alternating-current power supply 1, and the reactor 2 disposed on the first line 501. In addition, the first arm 31 includes the switching element 311, which is a first switching element, the switching element 312, which is a second switching element, and a third line 503 having a first connection point 506. The switching element 311 is connected in series to the switching element 312 by the third line 503. The first line 501 is connected to the first connection point 506. The first connection point 506 is connected to the alternating-current power supply 1 via the first line 501 and the reactor 2.

The second arm 32 includes the switching element 321, which is a third switching element, the switching element 322, which is a fourth switching element, and a fourth line 504 having a second connection point 508. The switching element 321 is connected in series to the switching element 322 by the fourth line 504. The second line 502 is connected to the second connection point 508. The second connection point 508 is connected to the alternating-current power supply 1 via the second line 502. The smoothing capacitor 4, which is a capacitor, is connected in parallel with the second arm 32.

MOSFETs formed of WBG semiconductors can be used for the switching elements 311, 312, 321, and 322. For the WBG semiconductors, gallium nitride (GaN) materials, silicon carbide (SiC), diamond, or aluminum nitride is used. Use of the WBG semiconductors for the switching elements 311, 312, 321, and 322 increases the withstand voltage characteristics and also increases the allowable current density, which allows miniaturization of modules. In addition, because the WBG semiconductors have high heat resistance, use of the WBG semiconductors for the switching elements 311, 312, 321, and 322 allows miniaturization of radiating fins for radiating heat generated by the switching elements.

The control unit 10 generates driving pulses for causing the switching elements 311, 312, 321, and 322 of the bridge circuit 3 to operate on the basis of signals output from the power supply voltage detecting unit 5, the power supply current detecting unit 6, and the bus voltage detecting unit 7. The power supply voltage detecting unit 5 detects a power supply voltage Vs, which is a voltage output from the alternating-current power supply 1, and outputs an electrical signal indicating the detection result to the control unit 10. The power supply current detecting unit 6 detects a power supply current Is, which is a current output from the alternating-current power supply 1, and outputs an electrical signal indicating the detection result to the control unit 10. The bus voltage detecting unit 7 detects a bus voltage Vdc, and outputs the detected bus voltage Vdc to the control unit 10. The bus voltage Vdc is a voltage obtained by smoothing a voltage output from the bridge circuit 3 by the smoothing capacitor 4.

Next, basic operation of the power converting apparatus 100 according to the first embodiment will be described. Hereinafter, the switching elements 311 and 321 connected to the positive side of the alternating-current power supply 1, that is, a positive terminal of the alternating-current power supply 1 may also be referred to as upper switching elements. In addition, the switching elements 312 and 322 connected to the negative side of the alternating-current power supply 1, that is, a negative terminal of the alternating-current power supply 1 may also be referred to as lower switching elements.

In the first arm 31, the upper switching element and the lower switching element operate complementarily. Specifically, when one of the upper switching element and the lower switching element is ON, the other is OFF. The switching elements 311 and 312 constituting the first arm 31 are driven by driving signals output from driving circuits, which will be described later. The driving circuits amplify PWM signals generated by the control unit 10, and output the amplified signals as driving signals. The operations of turning the switching elements ON or OFF in accordance with driving signals will hereinafter also be referred to as switching operations.

The switching elements 321 and 322 constituting the second arm 32 perform operations in accordance with driving signals to be turned ON or OFF in a manner similar to the switching elements 311 and 312. Basically, the switching elements are turned ON or OFF depending on a power supply voltage polarity that is the polarity of voltage output from the alternating-current power supply 1. Specifically, when the power supply voltage polarity is positive, the switching element 322 is ON and the switching element 321 is OFF, and when the power supply voltage polarity is negative, the switching element 321 is ON and the switching element 322 is OFF. In the first embodiment, however, as will be described later, in order to prevent a short circuit of the smoothing capacitor 4 via the alternating-current power supply 1 and the reactor 2, the switching element 322 and the switching element 321 are both OFF when the absolute value of the power supply current Is output from the alternating-current power supply 1 is equal to or smaller than a threshold. Alternatively, in order to prevent a short circuit of the smoothing capacitor 4 via the alternating-current power supply 1 and the reactor 2, the switching element 312 and the switching element 311 may both be OFF when the absolute value of the power supply current Is output from the alternating-current power supply 1 is equal to or smaller than a threshold. Hereinafter, the threshold to be compared with the absolute value of the power supply current Is will be referred to as a current threshold. In addition, hereinafter, the short circuit of the smoothing capacitor 4 will be referred to as a capacitor short circuit. The capacitor short circuit is a state in which the energy stored in the smoothing capacitor 4 is released and the current is regenerated back to the alternating-current power supply 1.

Next, the relation between the states of the switching elements in the first embodiment and the path of current flowing in the power converting apparatus 100 according to the first embodiment will be explained. Note that the structure of the MOSFETs will be described with reference to FIG. 2 before the explanation.

Figure 2:
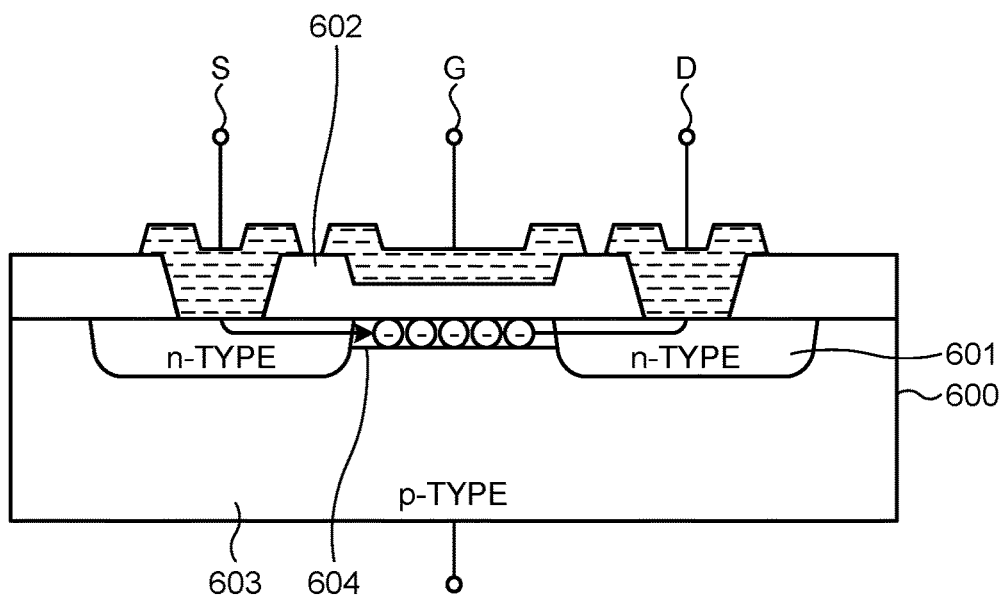
FIG. 2 is a schematic cross-sectional view illustrating an outline structure of a MOSFET that can be used as switching elements illustrated in FIG. 1.

FIG. 2 is a schematic cross-sectional view illustrating an outline structure of a MOSFET that can be used as the switching elements illustrated in FIG. 1. FIG. 2 illustrates an n-type MOSFET as an example. In an n-type MOSFET, a p-type semiconductor substrate 600 is used as illustrated in FIG. 2. A source electrode S, a drain electrode D, and a gate electrode G are formed on the semiconductor substrate 600. High-concentration impurity is introduced by ion implantation into portions in contact with the source electrode S and the drain electrode D to form n-type regions 601. In addition, an insulating oxide layer 602 is formed between a portion of the semiconductor substrate 600 where no n-type region 601 is formed and the gate electrode G. Thus, the insulating oxide layer 602 is present between the gate electrode G and a p-type region 603 of the semiconductor substrate 600.

When a positive voltage is applied to the gate electrode G, electrons are attracted to an interface between the p-type region 603 and the insulating oxide layer 602 of the semiconductor substrate 600, and the interface is negatively charged. The electron density of a portion where electrons have gathered becomes higher than a hole density, and the portion becomes n-type. The portion that has become n-type functions as a current path, and will be referred to as a channel 604. The channel 604 is an n-type channel in the example of FIG. 2. When the MOSFET is controlled to be ON, more current flows to the channel 604 than to a body diode formed in the p-type region 603.

FIGS. 3 to 6 illustrate current paths in the power converting apparatus 100 according to the first embodiment when the absolute value of the power supply current Is is larger than the current threshold.

Figure 3:
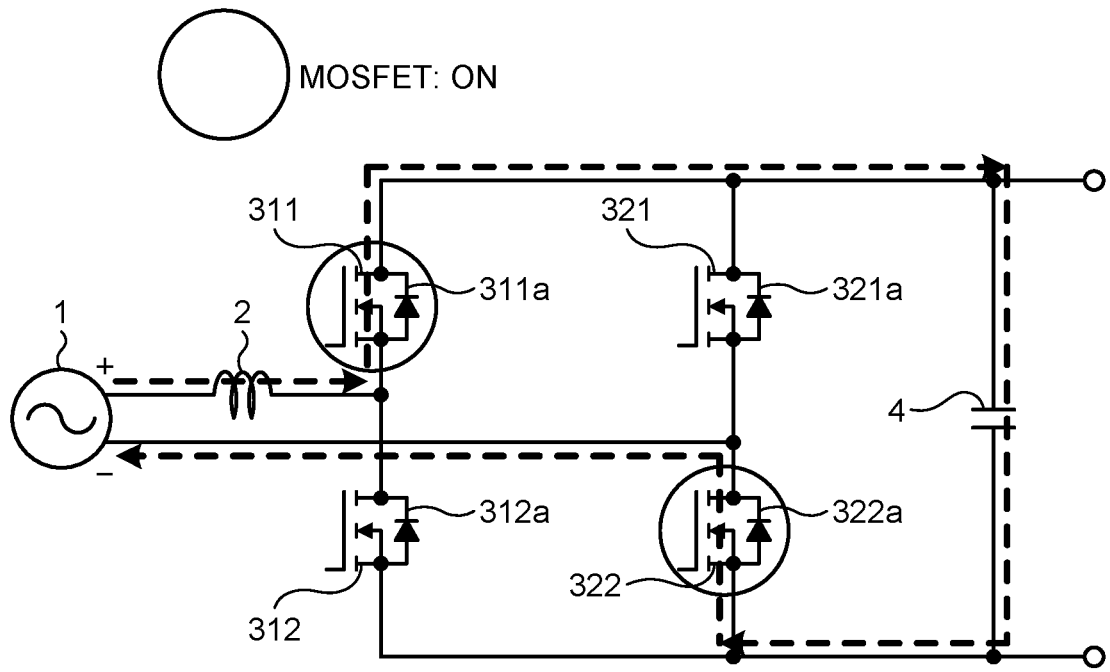
FIG. 3 is a first diagram illustrating a path of current flowing in the power converting apparatus according to the first embodiment when the absolute value of a power supply current is larger than a current threshold and a power supply voltage polarity is positive.

FIG. 3 is a first diagram illustrating a path of current flowing in the power converting apparatus according to the first embodiment when the absolute value of the power supply current is larger than the current threshold and the power supply voltage polarity is positive. In FIG. 3, the power supply voltage polarity is positive, the switching element 311 and the switching element 322 are ON, and the switching element 312 and the switching element 321 are OFF. In this state, current flows in the order of the alternating-current power supply 1, the reactor 2, the switching element 311, the smoothing capacitor 4, the switching element 322, and the alternating-current power supply 1. Thus, in the first embodiment, a synchronous rectification operation is performed in such a manner that current flows through each of the channels of the switching element 311 and the switching element 322 instead of flowing through the body diode 311a and the body diode 322a.

Figure 4:
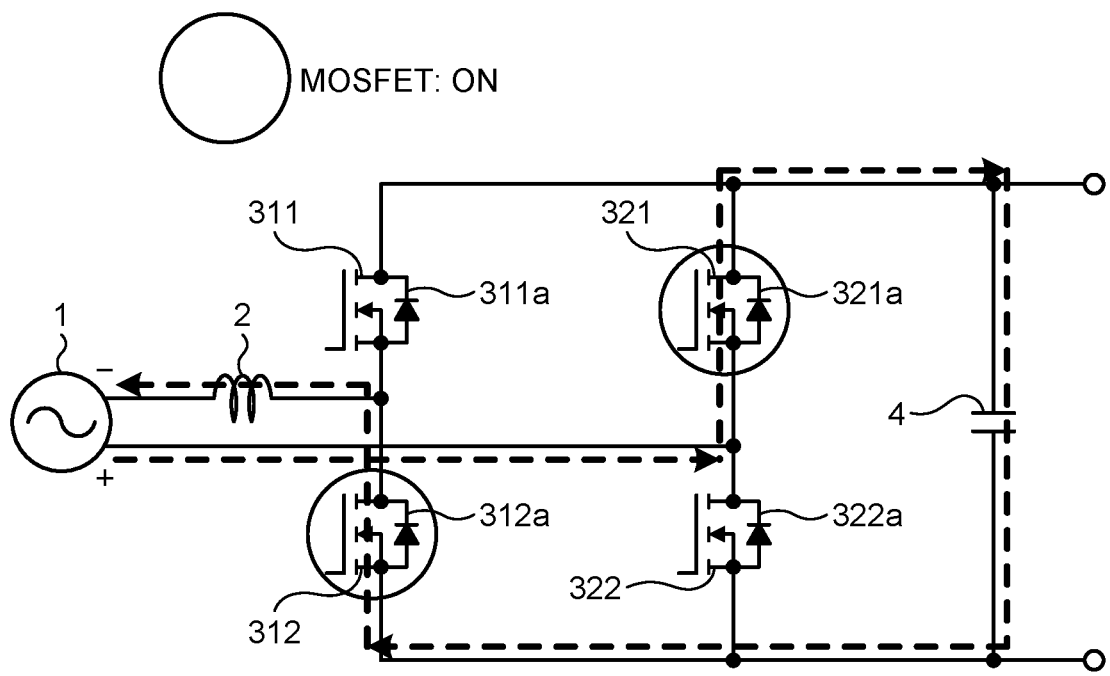
FIG. 4 is a first diagram illustrating a path of current flowing in the power converting apparatus according to the first embodiment when the absolute value of the power supply current is larger than the current threshold and the power supply voltage polarity is negative.

FIG. 4 is a first diagram illustrating a path of current flowing in the power converting apparatus according to the first embodiment when the absolute value of the power supply current is larger than the current threshold and the power supply voltage polarity is negative. In FIG. 4, the power supply voltage polarity is negative, the switching element 312 and the switching element 321 are ON, and the switching element 311 and the switching element 322 are OFF. In this state, current flows in the order of the alternating-current power supply 1, the switching element 321, the smoothing capacitor 4, the switching element 312, the reactor 2, and the alternating-current power supply 1. Thus, in the first embodiment, synchronous rectification operation is performed in such a manner that current flows through each of the channels of the switching element 321 and the switching element 312 instead of flowing through the body diode 321a and the body diode 312a.

Figure 5:
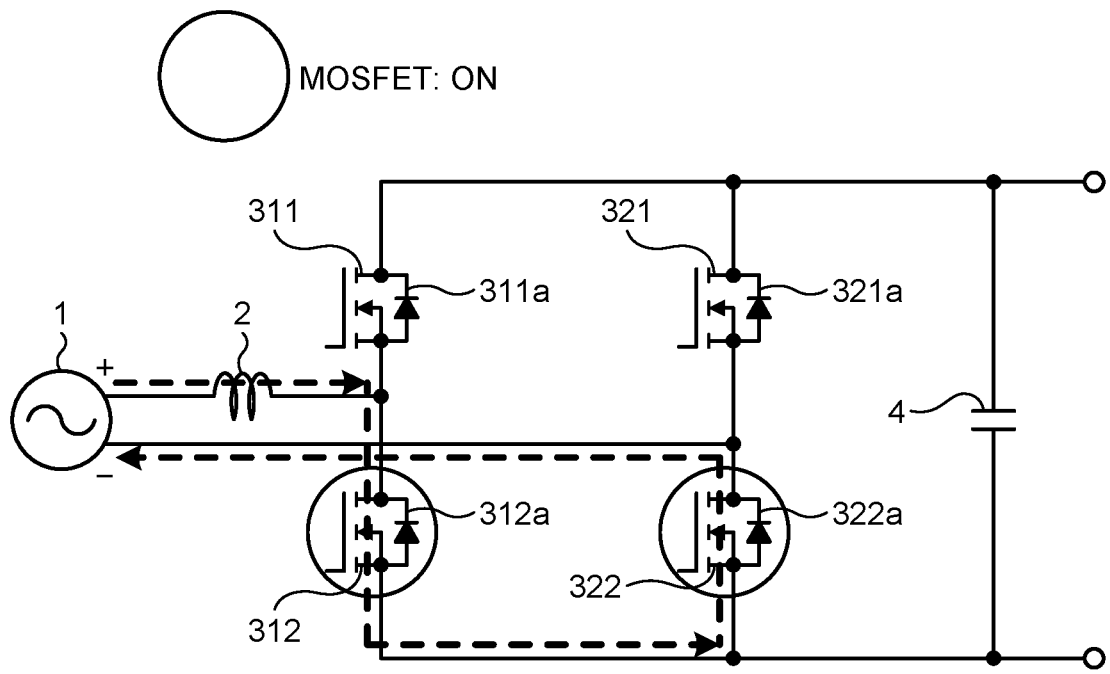
FIG. 5 is a second diagram illustrating a path of current flowing in the power converting apparatus according to the first embodiment when the absolute value of the power supply current is larger than the current threshold and the power supply voltage polarity is positive.

FIG. 5 is a second diagram illustrating a path of current flowing in the power converting apparatus according to the first embodiment when the absolute value of the power supply current is larger than the current threshold and the power supply voltage polarity is positive. In FIG. 5, the power supply voltage polarity is positive, the switching element 312 and the switching element 322 are ON, and the switching element 311 and the switching element 321 are OFF. In this state, current flows in the order of the alternating-current power supply 1, the reactor 2, the switching element 312, the switching element 322, and the alternating-current power supply 1, and a power supply short-circuit path that does not pass through the smoothing capacitor 4 is thus formed. Thus, in the first embodiment, the power supply short-circuit path is formed in such a manner that current flows through each of the channels of the switching element 312 and the switching element 322 instead of flowing through the body diode 312a and the body diode 322a.

Figure 6:
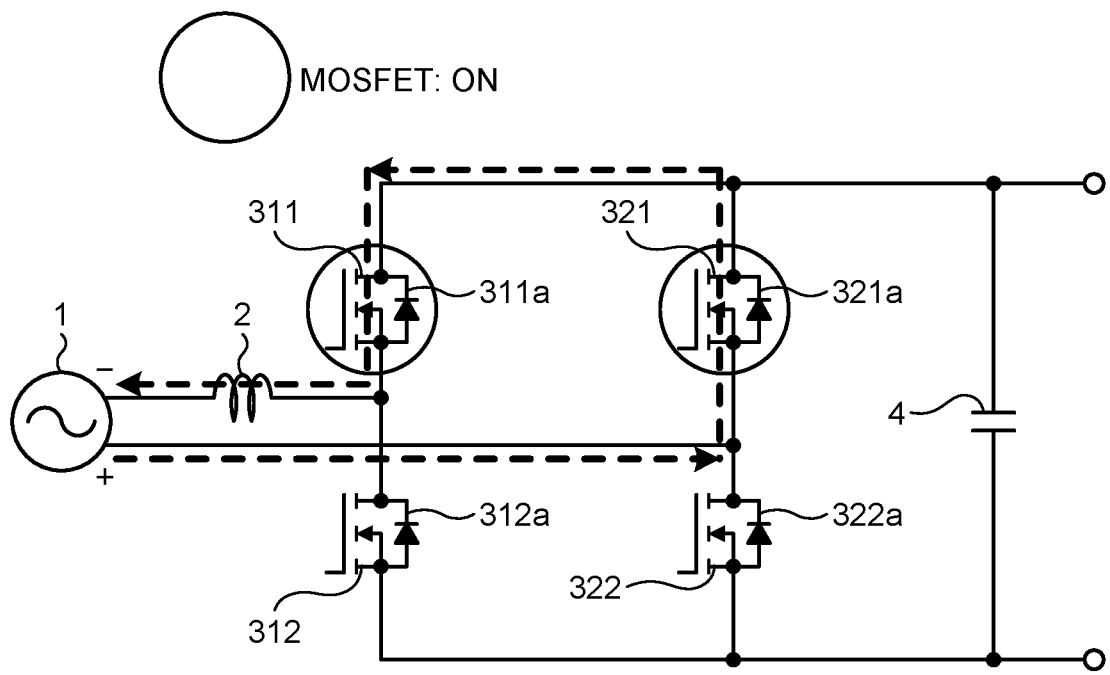
FIG. 6 is a second diagram illustrating a path of current flowing in the power converting apparatus according to the first embodiment when the absolute value of the power supply current is larger than the current threshold and the power supply voltage polarity is negative.

FIG. 6 is a second diagram illustrating a path of current flowing in the power converting apparatus according to the first embodiment when the absolute value of the power supply current is larger than the current threshold and the power supply voltage polarity is negative. In FIG. 6, the power supply voltage polarity is negative, the switching element 311 and the switching element 321 are ON, and the switching element 312 and the switching element 322 are OFF. In this state, current flows in the order of the alternating-current power supply 1, the switching element 321, the switching element 311, the reactor 2, and the alternating-current power supply 1, and a power supply short-circuit path that does not pass through the smoothing capacitor 4 is formed. Thus, in the first embodiment, the power supply short-circuit path is formed in such a manner that current flows through each of the channels of the switching element 311 and the switching element 321 instead of flowing through the body diode 311a and the body diode 321a.

The control unit 10 can control the values of the power supply current Is and the bus voltage Vdc by controlling switching of the current paths described above.

When the switching element 311 and the switching element 322 are turned ON while the power supply current Is is not flowing, however, a capacitor short circuit via the alternating-current power supply 1 and the reactor 2 occurs. As a result, current flows in a direction opposite to the normal direction, which may cause such problems as degradation in power factor, increase in harmonic components, damage to an element due to overcurrent, or increase in loss.

Figure 7:
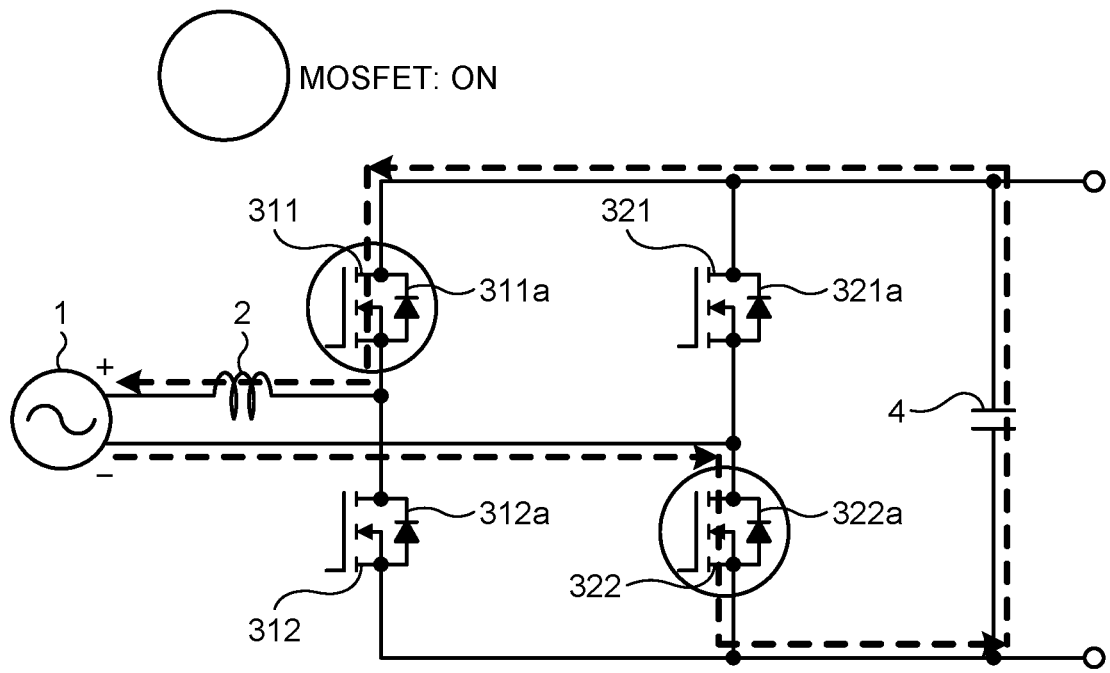
FIG. 7 is a first diagram for explaining an operation that causes a capacitor short circuit via an alternating-current power supply and a reactor in the power converting apparatus according to the first embodiment.
Figure 8:
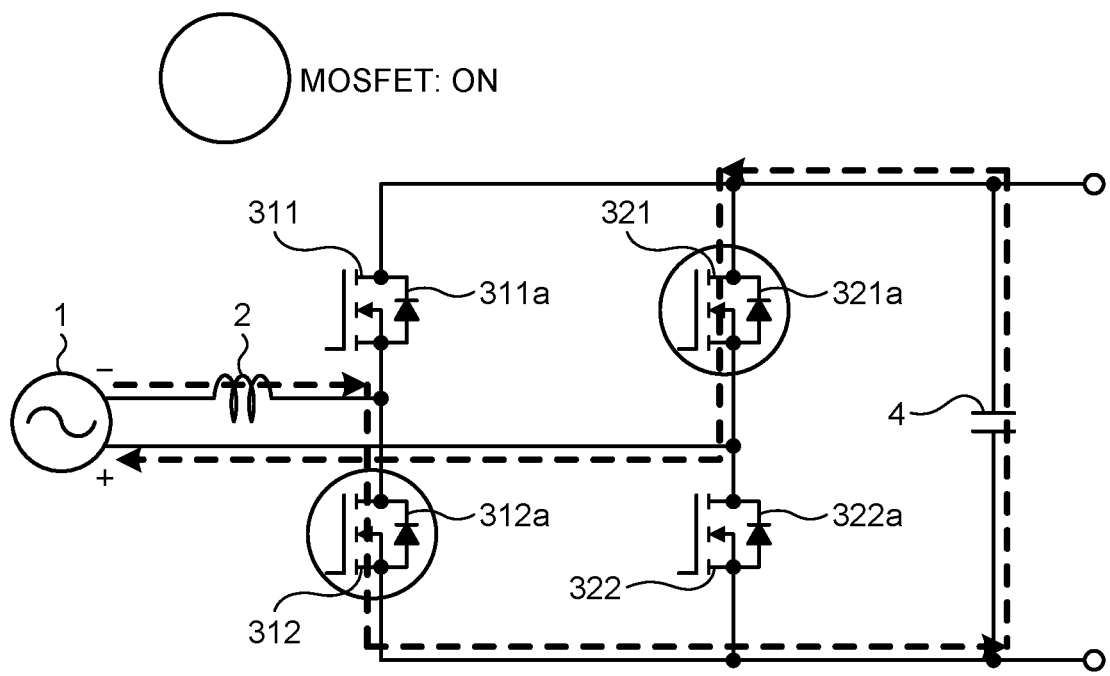
FIG. 8 is a second diagram for explaining an operation that causes a capacitor short circuit via the alternating-current power supply and the reactor in the power converting apparatus according to the first embodiment.

FIGS. 7 and 8 illustrate states in which a capacitor short circuit via the alternating-current power supply 1 and the reactor 2 occurs.

FIG. 7 is a first diagram for explaining an operation that causes a capacitor short circuit via the alternating-current power supply and the reactor in the power converting apparatus according to the first embodiment. FIG. 7 illustrates a state in which the power supply voltage polarity is positive, and the power supply current Is does not flow. Because the power supply voltage polarity is positive, current should normally flow in the order of the alternating-current power supply 1, the reactor 2, the switching element 311, the smoothing capacitor 4, the switching element 322, and the alternating-current power supply 1 as illustrated in FIG. 3. When the switching element 311 and the switching element 322 are turned ON while the power supply current Is is not flowing, however, current flows in the direction opposite to the normal direction and a capacitor short circuit thus occurs as illustrated in FIG. 7. Thus, the energy stored in the smoothing capacitor 4 is output to the alternating-current power supply 1.

FIG. 8 is a second diagram for explaining an operation that causes a capacitor short circuit via the alternating-current power supply and the reactor in the power converting apparatus according to the first embodiment. FIG. 8 illustrates a state in which the power supply voltage polarity is negative, and the power supply current Is does not flow. Because the power supply voltage polarity is negative, current should normally flow in the order of the alternating-current power supply 1, the switching element 321, the smoothing capacitor 4, the switching element 312, the reactor 2, and the alternating-current power supply 1 as illustrated in FIG. 4. When the switching element 312 and the switching element 321 are turned ON in the case where the power supply current Is is not flowing, however, current flows in the direction opposite to the normal direction and a capacitor short circuit occurs as illustrated in FIG. 8.

In order to prevent a capacitor short circuit, the power converting apparatus 100 according to the first embodiment permits the switching elements 321 and 322 to be in the ON state when the absolute value of the power supply current Is is equal to or larger than the current threshold, and turns the switching elements 321 and 322 OFF when the absolute value of the power supply current Is is smaller than the threshold. This enables prevention of a capacitor short circuit via the alternating-current power supply 1 and the reactor 2, and can achieve a highly reliable power converting apparatus.

FIGS. 9 to 12 illustrate current paths in the power converting apparatus 100 according to the first embodiment when the absolute value of the power supply current Is is smaller than the current threshold.

Figure 9:
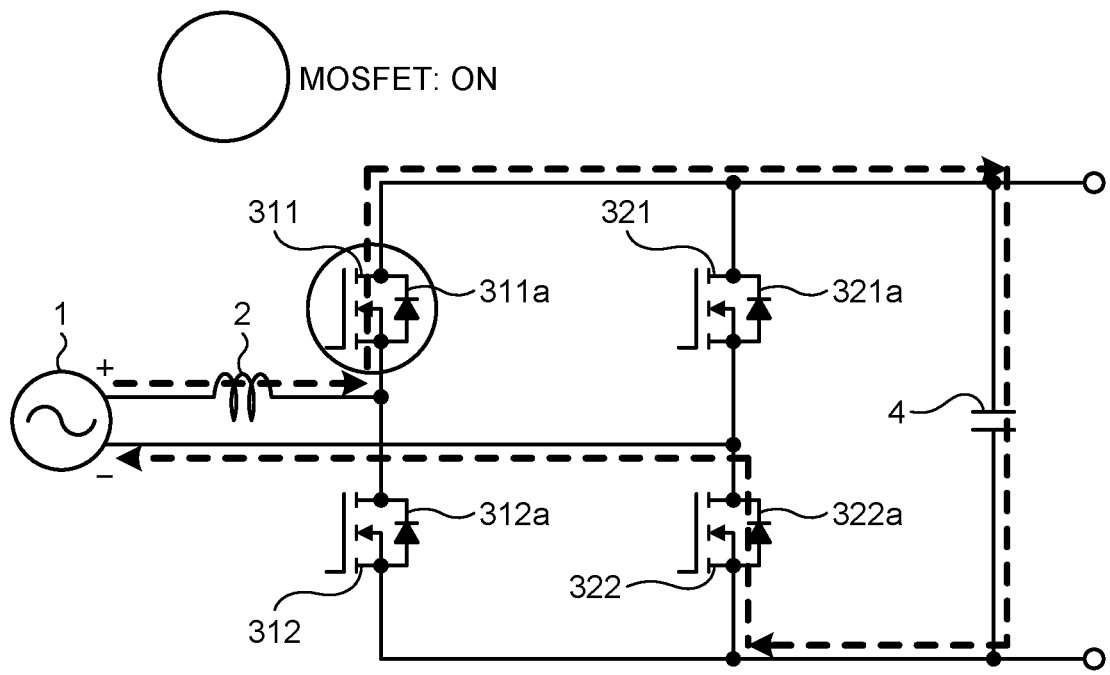
FIG. 9 is a first diagram illustrating a path of current flowing in the power converting apparatus according to the first embodiment when the absolute value of the power supply current is smaller than the current threshold and the power supply voltage polarity is positive.

FIG. 9 is a first diagram illustrating a path of current flowing in the power converting apparatus according to the first embodiment when the absolute value of the power supply current is smaller than the current threshold and the power supply voltage polarity is positive. In FIG. 9, the power supply voltage polarity is positive, the switching element 311 is ON, and the switching element 312, the switching element 321, and the switching element 322 are OFF. In this case, the body diode 322a of the switching element 322 functions as a freewheeling diode, and current flows in the order of the alternating-current power supply 1, the reactor 2, the switching element 311, the smoothing capacitor 4, the body diode 322a, and the alternating-current power supply 1 as illustrated in FIG. 9. Note that it is sufficient if the absolute value of the power supply current Is is such a value that does not cause malfunctions, and as the absolute value is smaller, the synchronous rectification period is longer and conduction loss can be reduced more effectively. In addition, when the absolute value of the power supply current Is is such a small value that does not require the synchronous rectification operation, the switching element 311 may be turned OFF. When the switching element 311 is turned OFF, no gate driving power of the switching element 311 is generated, which can reduce power consumption for generating driving signals as compared with a case where the synchronous rectification operation is performed. Note that details of the driving circuits that generate driving signals will be described later.

Figure 10:
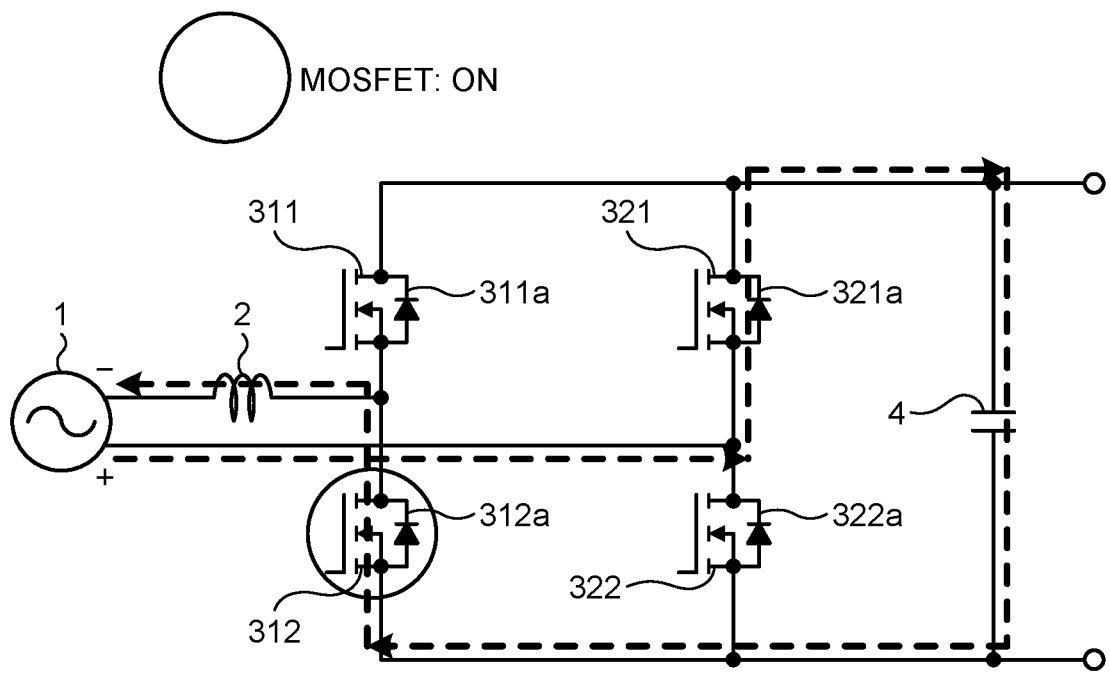
FIG. 10 is a first diagram illustrating a path of current flowing in the power converting apparatus according to the first embodiment when the absolute value of the power supply current is smaller than the current threshold and the power supply voltage polarity is negative.

FIG. 10 is a first diagram illustrating a path of current flowing in the power converting apparatus according to the first embodiment when the absolute value of the power supply current is smaller than the current threshold and the power supply voltage polarity is negative. In FIG. 10, the power supply voltage polarity is negative, the switching element 312 is ON, and the switching element 311, the switching element 321, and the switching element 322 are OFF. In this case, the body diode 321a of the switching element 321 functions as a freewheeling diode, and current flows in the order of the alternating-current power supply 1, the body diode 321a, the smoothing capacitor 4, the switching element 312, the reactor 2, and the alternating-current power supply 1 as illustrated in FIG. 10. Note that it is sufficient if the absolute value of the power supply current Is is such a value that does not cause malfunctions, and as the absolute value is smaller, the synchronous rectification period is longer and conduction loss can be reduced more effectively. In addition, when the absolute value of the power supply current Is is such a small value that does not require the synchronous rectification operation, the switching element 312 may be turned OFF. When the switching element 312 is turned OFF, no gate driving power of the switching element 312 is generated, which can reduce power consumption for generating driving signals as compared with a case where the synchronous rectification operation is performed.

Figure 11:
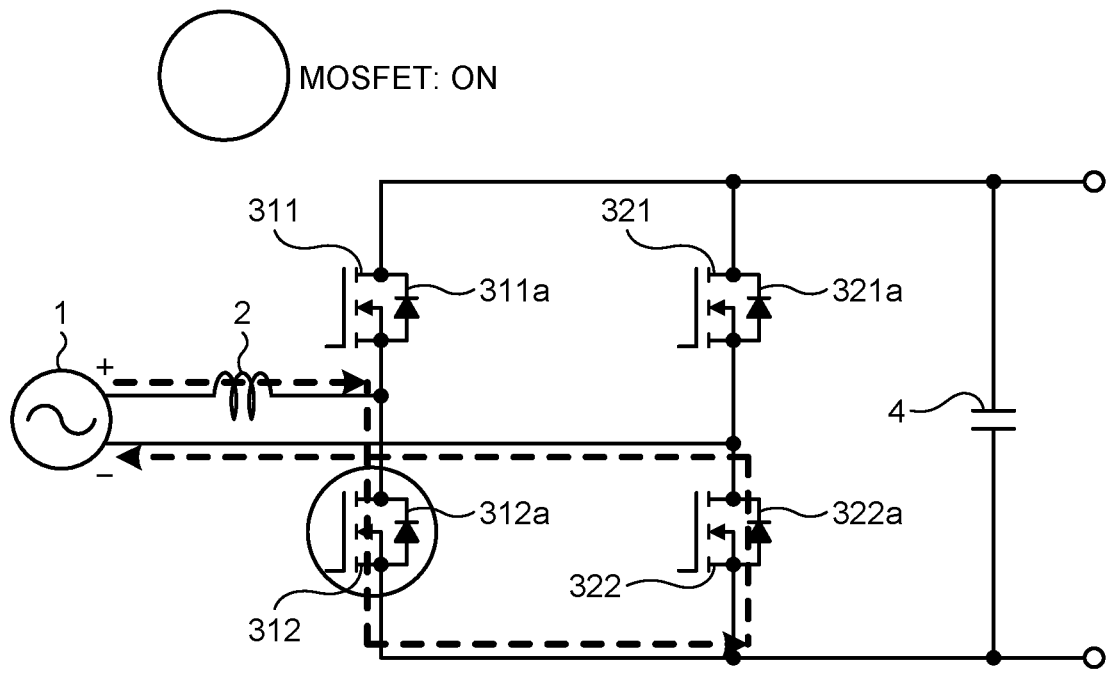
FIG. 11 is a second diagram illustrating a path of current flowing in the power converting apparatus according to the first embodiment when the absolute value of the power supply current is smaller than the current threshold and the power supply voltage polarity is positive.

FIG. 11 is a second diagram illustrating a path of current flowing in the power converting apparatus according to the first embodiment when the absolute value of the power supply current is smaller than the current threshold and the power supply voltage polarity is positive. In FIG. 11, the power supply voltage polarity is positive, the switching element 312 is ON, and the switching element 311, the switching element 321, and the switching element 322 are OFF. In this case, the body diode 322a of the switching element 322 functions as a freewheeling diode, and current flows in the order of the alternating-current power supply 1, the reactor 2, the switching element 312, the body diode 322a, and the alternating-current power supply 1 as illustrated in FIG. 11. Note that, in this case, because a short-circuit current flows, even when the absolute value of the power supply current Is is smaller than the current threshold, the switching element 322 may be turned ON at the same time when the switching element 312 is turned ON. In this case, because a drop voltage due to an ON-resistance of the switching element 322 is smaller than a forward voltage of the body diode 322a, the conduction loss at the switching element 322 is reduced.

Figure 12:
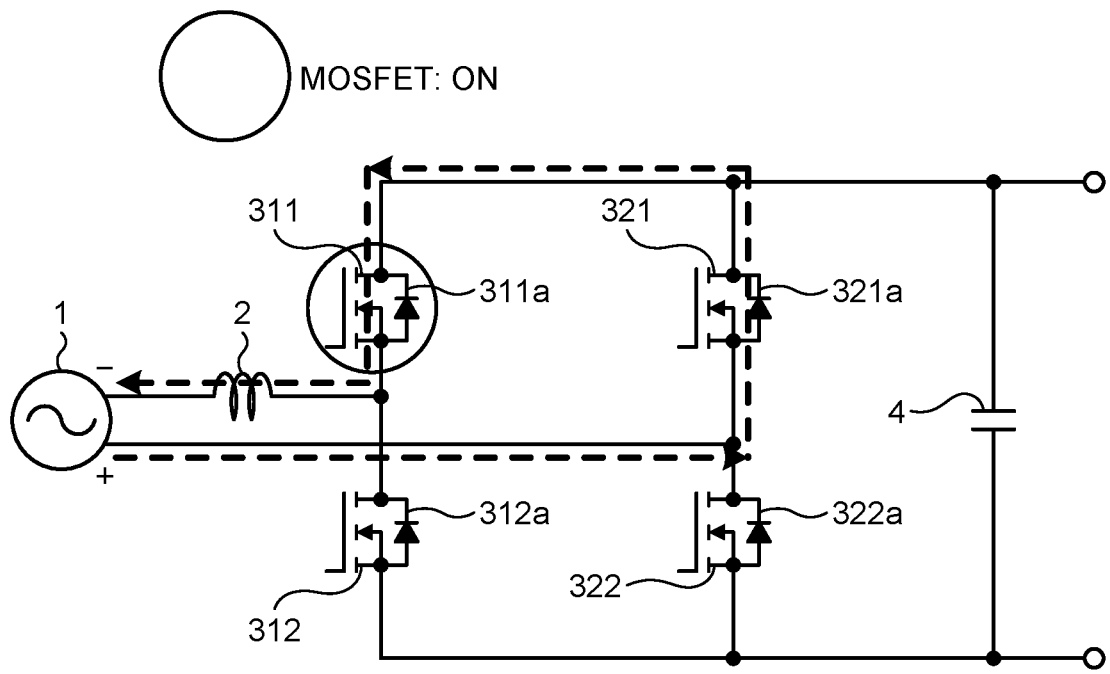
FIG. 12 is a second diagram illustrating a path of current flowing in the power converting apparatus according to the first embodiment when the absolute value of the power supply current is smaller than the current threshold and the power supply voltage polarity is negative.

FIG. 12 is a second diagram illustrating a path of current flowing in the power converting apparatus according to the first embodiment when the absolute value of the power supply current is smaller than the current threshold and the power supply voltage polarity is negative. In FIG. 12, the power supply voltage polarity is negative, the switching element 311 is ON, and the switching element 312, the switching element 321, and the switching element 322 are OFF. In this case, the body diode 321a of the switching element 321 functions as a freewheeling diode, and current flows in the order of the alternating-current power supply 1, the body diode 321a, the switching element 311, the reactor 2, and the alternating-current power supply 1 as illustrated in FIG. 12. Note that, in this case, because a short-circuit current flows, even when the absolute value of the power supply current Is is smaller than the current threshold, the switching element 321 may be turned ON at the same time when the switching element 311 is turned ON. In this case, because a drop voltage due to an ON-resistance of the switching element 321 is smaller than a forward voltage of the body diode 321a, the conduction loss at the switching element 321 is reduced.

Figure 13:
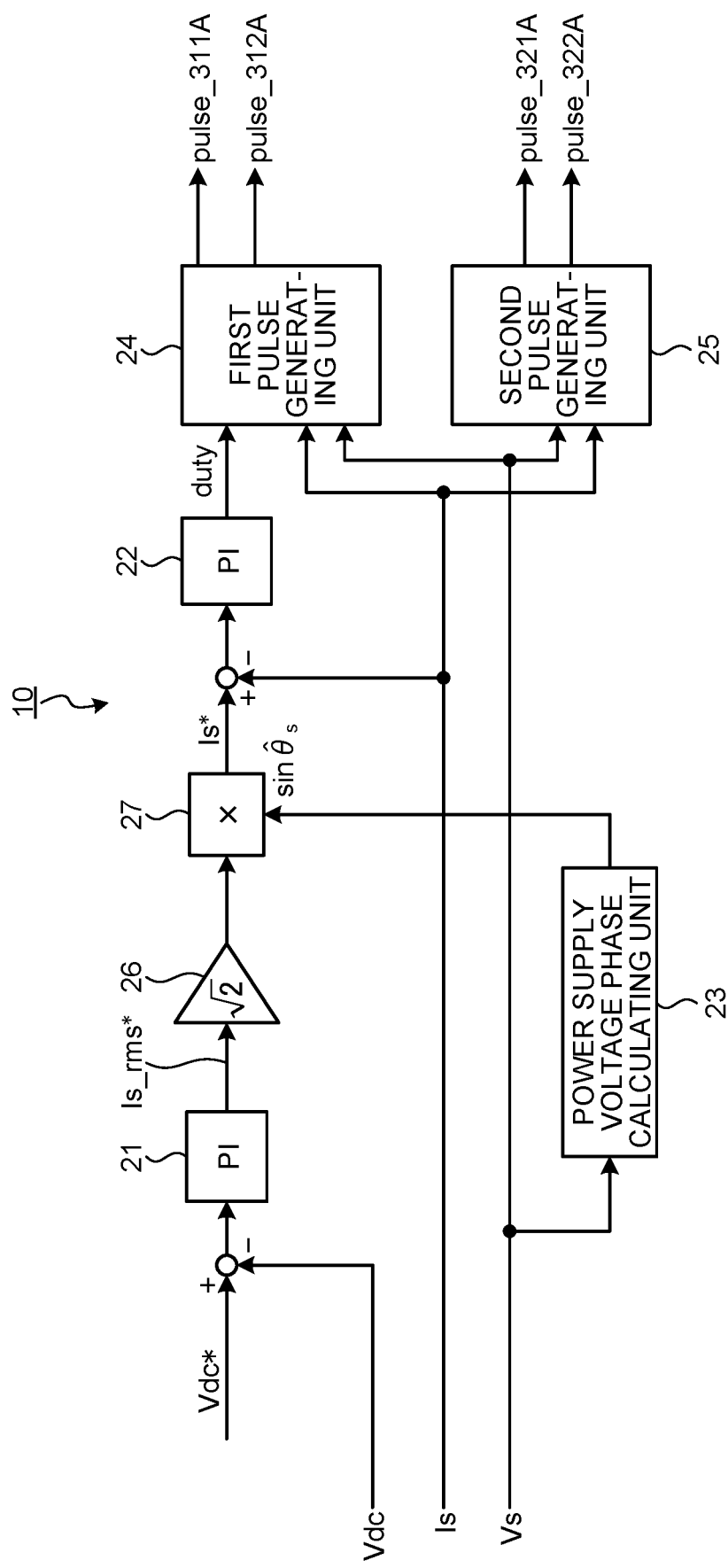
FIG. 13 is a diagram illustrating an example of a configuration of a control unit of the power converting apparatus according to the first embodiment.

Next, a configuration of the control unit 10 of the power converting apparatus 100 according to the first embodiment will be described. FIG. 13 is a diagram illustrating an example of the configuration of the control unit of the power converting apparatus according to the first embodiment. As illustrated in FIG. 13, the control unit 10 includes a power supply current command value control unit 21, an ON-duty control unit 22, a power supply voltage phase calculating unit 23, a first pulse generating unit 24, a second pulse generating unit 25, a current command value calculating unit 26, and an instantaneous value command value calculating unit 27.

The power supply current command value control unit 21 calculates an effective current value command value Is_rms* from a bus voltage Vdc detected by the bus voltage detecting unit 7 and a bus voltage command value Vdc*. The bus voltage command value Vdc* may be set in advance or may be input from outside of the power converting apparatus 100. The power supply current command value control unit 21 calculates the effective current value command value Is_rms* by proportional-integral control based on a difference between the bus voltage Vdc and the bus voltage command value Vdc*.

The current command value calculating unit 26 converts the effective current value command value Is_rms* into a sinusoidal command value, and outputs the sinusoidal command value. The instantaneous value command value calculating unit 27 calculates a power supply current instantaneous value command value Is* by using the effective current value command value Is_rms* calculated by the current command value calculating unit 26, and a sinusoidal value $\sin \hat{\theta}_s$ calculated by the power supply voltage phase calculating unit 23.

The ON-duty control unit 22 performs proportional-integral control on a deviation between the power supply current instantaneous value command value Is* calculated by the instantaneous value command value calculating unit 27 and the power supply current Is detected by the power supply current detecting unit 6 to calculate a reference ON-duty duty of the switching elements 311 and 312.

Figure 14:
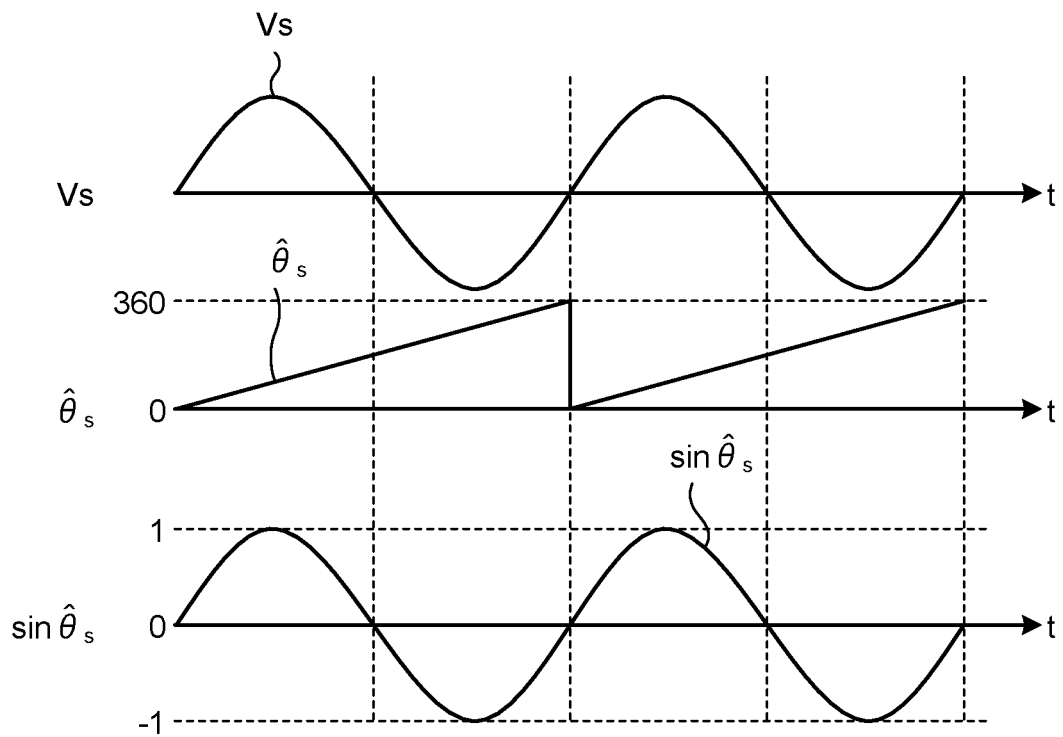
FIG. 14 is a chart illustrating an example of a power supply voltage, and a power supply voltage phase estimation value and a sinusoidal value calculated by a power supply voltage phase calculating unit illustrated in FIG. 13.

The power supply voltage phase calculating unit 23 calculates a power supply voltage phase estimation value $\hat{\theta}_s$ and the sinusoidal value $\sin \hat{\theta}_s$ by using the power supply voltage Vs detected by the power supply voltage detecting unit 5. FIG. 14 is a chart illustrating an example of the power supply voltage, and the power supply voltage phase estimation value and the sinusoidal value calculated by the power supply voltage phase calculating unit illustrated in FIG. 13. FIG. 14 illustrates the power supply voltage Vs, the power supply voltage phase estimation value $\hat{\theta}_s$, and the sinusoidal value $\sin \hat{\theta}_s$ in this order from the top.

The power supply voltage phase calculating unit 23 linearly increases the power supply voltage phase estimation value $\hat{\theta}_s$, detects a timing at which the power supply voltage Vs changes from the negative polarity to the positive polarity, and resets the power supply voltage phase estimation value $\hat{\theta}_s$ to 0 at the timing. As a result, under an ideal condition with no control delay and no detection delay, the power supply voltage phase estimation value $\hat{\theta}_s$ becomes 360°, that is, 0° at the timing when the power supply voltage Vs is switched from the negative polarity to the positive polarity. The power supply voltage phase calculating unit 23 calculates the sinusoidal value $\sin \hat{\theta}_s$ on the basis of the calculated power supply voltage phase estimation value $\hat{\theta}_s$. Note that, in a case of implementing resetting of the power supply voltage phase estimation value $\hat{\theta}_s$ by using an interrupt function of a microcomputer, the power supply voltage phase calculating unit 23 resets the power supply voltage phase estimation value $\hat{\theta}_s$ by using a signal output from a zero crossing detecting circuit as an interrupt signal. The zero crossing detecting circuit is a circuit that detects a timing at which the power supply voltage Vs switches from the negative polarity to the positive polarity. Note that the method for calculating the power supply voltage phase estimation value $\hat{\theta}_s$ is not limited to the example described above, and any method may be used therefor.

Figure 15:
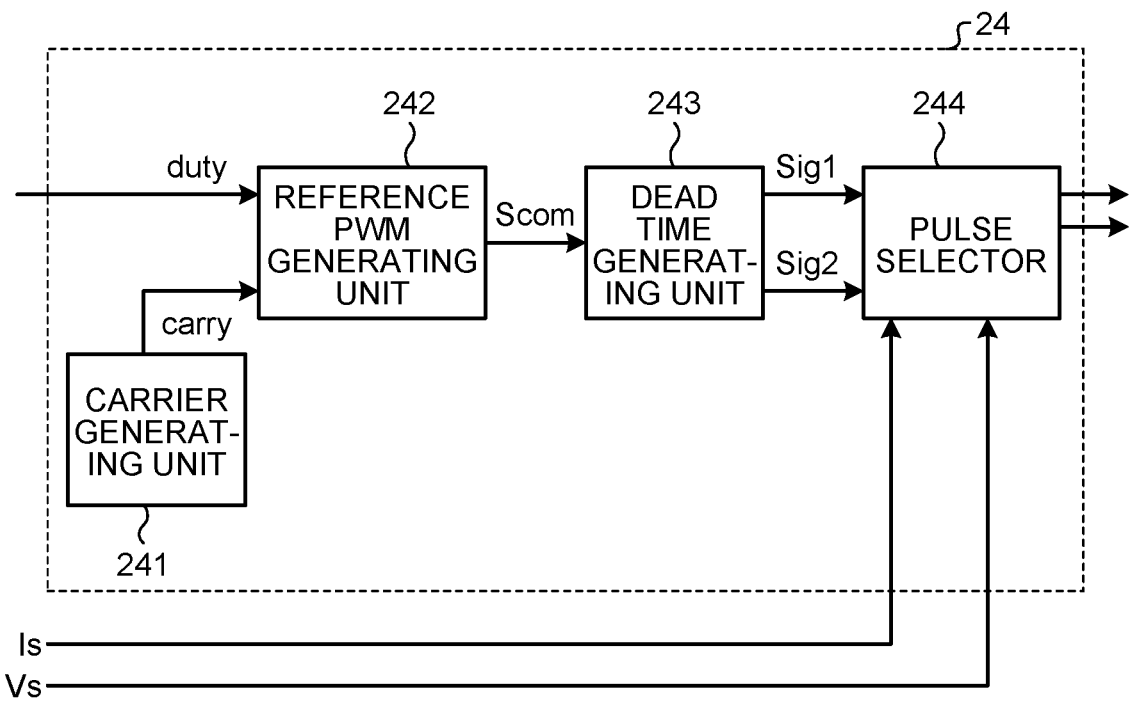
FIG. 15 is a diagram illustrating an example of a configuration of a first pulse generating unit of the power converting apparatus according to the first embodiment.

FIG. 15 is a diagram illustrating an example of a configuration of the first pulse generating unit of the power converting apparatus according to the first embodiment. The first pulse generating unit 24 includes a carrier generating unit 241, a reference PWM generating unit 242, a dead time generating unit 243, and a pulse selector 244.

The carrier generating unit 241 generates a carrier wave carry, which is a carrier signal. The carrier wave carry is used for generation of a reference PWM signal Scom. An example of the carrier wave carry can be a triangular wave with a peak value "1" and a trough value "0". The reference PWM signal Scom is a signal that is a reference of PWM signals used for driving the switching elements 311, 312, 321, and 322. As described above, in the first embodiment, complementary PWM control is assumed, in which a reference PWM signal is used for driving one of the switching elements of the first arm 31, and a PWM signal complementary to the reference PWM signal is used for the other of the switching elements of the first arm 31.

Figure 16:
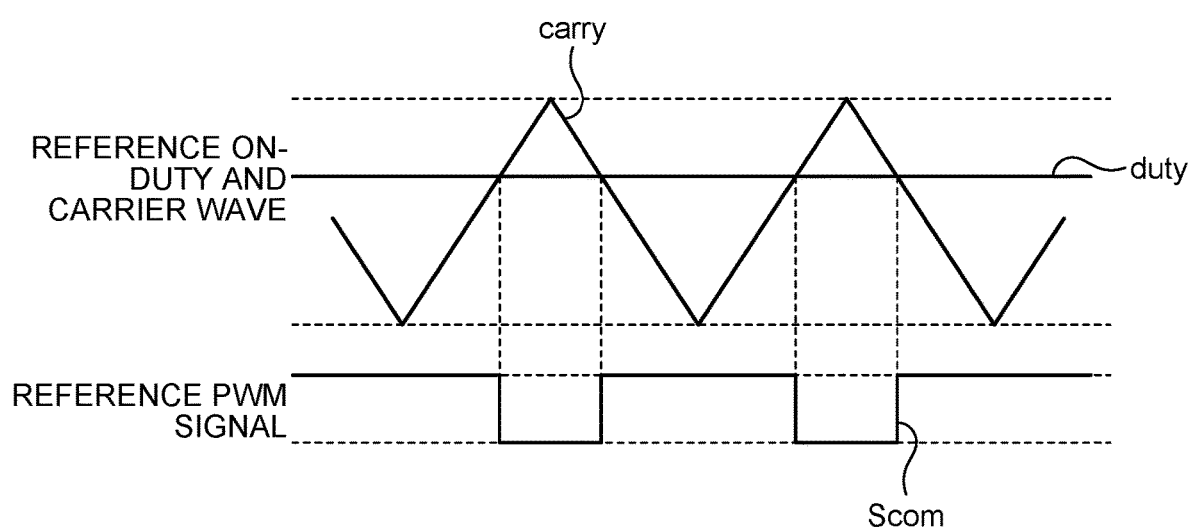
FIG. 16 is a chart illustrating an example of a reference ON-duty, a carrier wave, and a reference pulse width modulation (PWM) signal in FIG. 15.

The reference PWM generating unit 242 compares the magnitudes of the reference ON-duty duty calculated by the ON-duty control unit 22 illustrated in FIG. 13 and the carrier wave carry to generate the reference PWM signal Scom. FIG. 16 is a chart illustrating an example of the reference ON-duty, the carrier wave, and the reference PWM signal in FIG. 15. As illustrated in FIG. 16, the reference PWM generating unit 242 generates the reference PWM signal Scom in such a manner that the reference PWM signal Scom has a value representing ON in the case where reference ON-duty duty>carrier wave carry, and that the reference PWM signal Scom has a value representing OFF in the case where reference ON-duty duty≤carrier wave carry. FIG. 16 illustrates a high active reference PWM signal Scom as an example. The high active reference PWM signal Scom is a signal with a high level representing ON and a low level representing OFF. Note that the signal generated by the reference PWM generating unit 242 is not limited to a high active reference PWM signal Scom, and may be a low active reference PWM signal Scom. The low active reference PWM signal Scom is a signal with a high level representing OFF and a low level representing ON.

The description refers back to FIG. 15, in which the dead time generating unit 243 generates a first PWM signal Sig1 and a second PWM signal Sig2, which are two complementary signals, on the basis of the reference PWM signal Scom, and outputs the first PWM signal Sig1 and the second PWM signal Sig2. Specifically, the dead time generating unit 243 generates an inverted PWM signal Scom' that is a signal obtained by inverting the reference PWM signal Scom. The dead time generating unit 243 then generates the first PWM signal Sig1 and the second PWM signal Sig2 by setting a dead time in the reference PWM signal Scom and the inverted PWM signal Scom'.

Specifically, the dead time generating unit 243 generates the first PWM signal Sig1 and the second PWM signal Sig2 such that the first PWM signal Sig1 and the second PWM signal Sig2 both have a value representing OFF during the dead time. In one example, the dead time generating unit 243 makes the first PWM signal Sig1 identical to the reference PWM signal Scom. In addition, the dead time generating unit 243 generates the second PWM signal Sig2 by changing a signal value of the inverted PWM signal Scom' from a value representing ON to a value representing OFF during the dead time.

In the case where the inverted PWM signal Scom' is generated by inversion of the reference PWM signal Scom and two switching elements constituting one arm are respectively driven by the reference PWM signal Scom and the inverted PWM signal Scom', there is, ideally, no period during which two switching elements constituting one arm are ON at the same time. Typically, however, a delay occurs in a transition from an ON state to an OFF state, and a delay occurs in a transition from an OFF state to an ON state. Thus, the delays result in a period during which two switching elements constituting one arm are ON at the same time, and may cause short-circuit of the two switching elements constituting one arm. The dead time is a period set such that two switching elements constituting one arm are not on at the same time even when a delay in a state transition occurs. During the dead time, two PWM signals for driving the two switching elements constituting one arm are both set to a value representing OFF.

Figure 17:
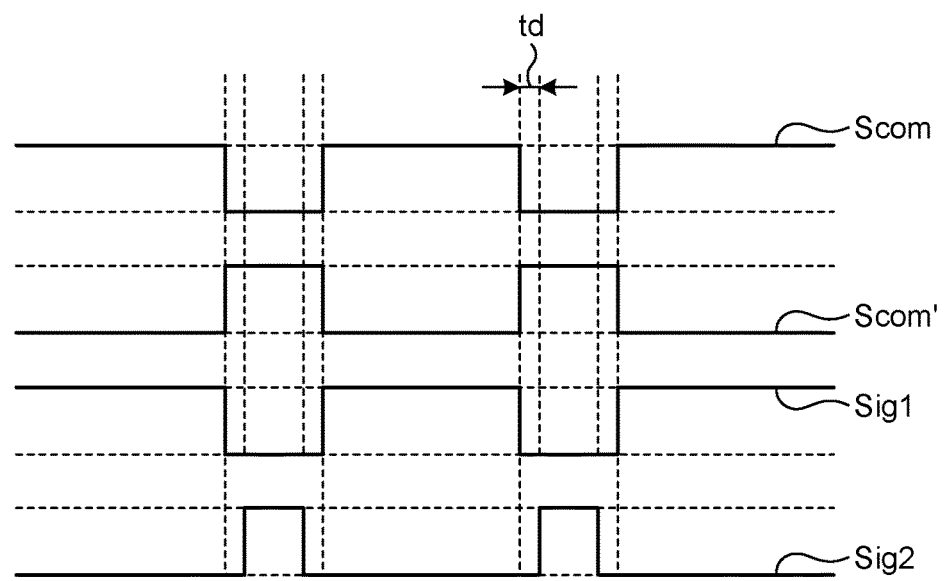
FIG. 17 is a chart illustrating an example of the reference PWM signal, an inverted PWM signal, a first PWM signal, and a second PWM signal in FIG. 15.

FIG. 17 is a chart illustrating an example of the reference PWM signal, the inverted PWM signal, the first PWM signal, and the second PWM signal in FIG. 15. FIG. 17 illustrates the reference PWM signal Scom, the inverted PWM signal Scom', the first PWM signal Sig1, and the second PWM signal Sig2 in this order from the top. In FIG. 17, when the inverted PWM signal Scom' has a value representing ON, the second PWM signal Sig2 has a value representing OFF during a dead time td. Note that the method for generating the dead time td described above is an example, the method for generating the dead time td is not limited to the above-described example, and any method may be used therefor.

Figure 18:
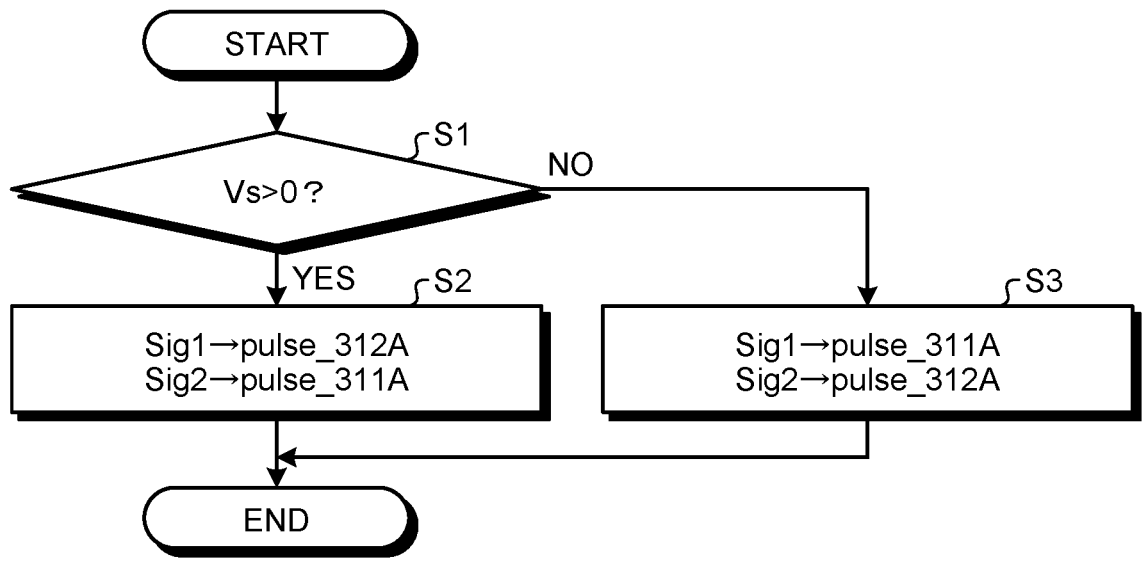
FIG. 18 is a flowchart illustrating an example of procedures of a selecting process performed by a pulse selector of the first pulse generating unit illustrated in FIG. 15.

The description refers back to FIG. 15, in which the pulse selector 244 determines which of the driving circuits for the switching element 311 and the switching element 312 to transmit each of the first PWM signal Sig1 and the second PWM signal Sig2 output from the dead time generating unit 243. FIG. 18 is a flowchart illustrating an example of procedures of a selecting process performed by the pulse selector of the first pulse generating unit illustrated in FIG. 15. The pulse selector 244 first determines whether or not the polarity of the power supply voltage Vs is positive, that is Vs>0 (step S1). If the polarity of the power supply voltage Vs is positive (step S1: Yes), the pulse selector 244 transmits the first PWM signal Sig1 as pulse_312A to the driving circuit for the switching element 312, and transmits the second PWM signal Sig2 as pulse_311A to the driving circuit for the switching element 311 (step S2). This is because, when the power supply voltage Vs is positive, the current path is switched between the current path illustrated in FIG. 5 and the current path illustrated in FIG. 3 by turning OFF or ON of the switching element 311 and the switching element 312, that is, the bus voltage Vdc and the power supply current Is are controlled by switching operation of the switching element 311 and the switching element 312.

If the polarity of the power supply voltage Vs is negative (step S1: No), the pulse selector 244 transmits the first PWM signal Sig1 as pulse_311A to the driving circuit for the switching element 311, and transmits the second PWM signal Sig2 as pulse_312A to the driving circuit for the switching element 312 (step S3). This is because, when the power supply voltage Vs is negative, the current path is switched between the current path illustrated in FIG. 6 and the current path illustrated in FIG. 4 by turning OFF or ON of the switching element 311 and the switching element 312, that is, the bus voltage Vdc and the power supply current Is are controlled by switching operation of the switching element 311 and the switching element 312. The pulse selector 244 repeats the above-described operation each time the polarity of the power supply voltage Vs changes.

As described above, the first pulse generating unit 24 generates pulse_311A that is a signal for driving the switching element 311 and pulse_312A that is a signal for driving the switching element 312.

As described above, because the switching element 311 and the switching element 312 are complementarily controlled, the process of generating the inverted PWM signal Scom' from the reference PWM signal Scom can be achieved by using a simple signal inversion process. In addition, the relation of driving pulse outputs in one carrier can be made approximately the same regardless of the power supply voltage polarity, and prevention of a short circuit of the upper and lower arms can be easily achieved. Stable control can be achieved by simple processes.

Figure 19:
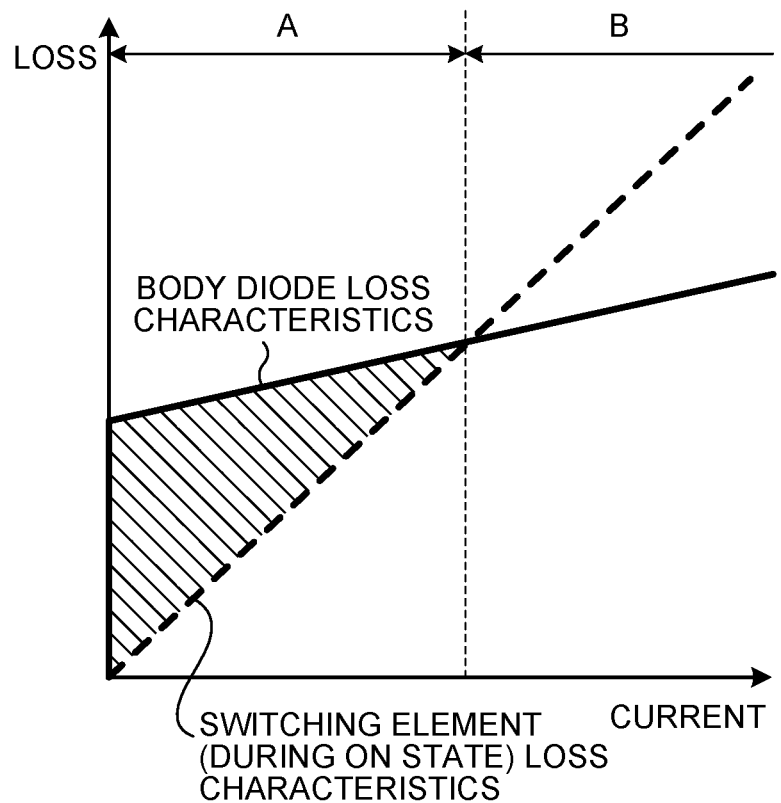
FIG. 19 is a schematic graph illustrating the relation of currents flowing through a switching element and a body diode illustrated in FIG. 1, the loss of the switching element, and the loss of the body diode.

In addition, in the power converting apparatus 100 according to the first embodiment, synchronous rectification control by the switching elements 311 and 312 of the first arm 31 can be achieved. Thus, in the power converting apparatus 100 according to the first embodiment, loss can be reduced in a region in which the loss of a switching element is smaller than the loss of a body diode, that is, a region in which each of currents flowing through the switching element and the body diode is small as illustrated in FIG. 19. Thus, a highly-efficient system can be achieved.

FIG. 19 is a schematic graph illustrating the relation of currents flowing through a switching element and a body diode illustrated in FIG. 1, the loss of the switching element, and the loss of the body diode. The horizontal axis in FIG. 19 represents a current flowing through the switching element in the ON state, and a current flowing through the body diode. The vertical axis in FIG. 19 represents a loss caused when the current flows through the switching element in the ON state and a loss caused when the current flows through the body diode. A solid line depicts the loss characteristics of the body diode. The loss characteristics of the body diode indicate the relation between the current flowing through the body diode and the loss caused by the ON-resistance of the body diode when the current flows. A dotted line depicts the loss characteristics of the switching element in the ON state. The loss characteristics indicate the relation between the current flowing through the carrier of the switching element and the loss caused by the ON-resistance of the switching element when the current flows. A region represented by a sign A is a region in which the currents flowing through the switching element and the body diode are small. A region represented by a sign B is a region in which the currents flowing through the switching element and the body diode are large. At the boundary between the region A and the region B, the currents are equal to a current value at which the value of the loss caused in the switching element and the value of the loss caused in the body diode are equal.

As illustrated in FIG. 19, in the region B in which the loss of the switching element is higher than the loss of the body diode, the complementary operation is stopped, so that an increase in the loss due to the synchronous rectification control can be prevented or reduced. Thus, by the control of switching between performing and not performing the synchronous rectification control depending on the power supply current Is, a highly efficient system can be achieved in all load regions.

Note that optimal values according to a driving condition are present for control parameters used for computation by the power supply current command value control unit 21 and the ON-duty control unit 22 illustrated in FIG. 13. The driving condition is expressed by at least one value of the power supply voltage Vs, the power supply current Is, and the bus voltage Vdc. For example, it is desirable that a proportional control gain in the ON-duty control unit 22 change in inverse proportion to the bus voltage Vdc. This is because, if the value of a control parameter is constant with respect to a change in in the driving condition, the control parameter will significantly deviate from a value suitable for control, and as a result, harmonics of the power supply current Is may increase, pulsation of the bus voltage Vdc may increase, and power-supply power factor may decrease. In order to prevent or reduce such increase in pulsation of the bus voltage Vdc, decrease in the power-supply power factor, and the like, the power supply current command value control unit 21 and the ON-duty control unit 22 may hold a calculation formula or a table for implementing a desired circuit operation, and adjust a control parameter on the basis of detected information by using the calculation formula or the table. The configuration to adjust a control parameter on the basis of detected information makes the control parameter a value suitable for control, which improves controllability. Note that the detected information is at least one of the power supply voltage Vs, the power supply current Is, and the bus voltage Vdc, or information from which these values can be estimated, for example. An example of the information from which the values can be estimated is power information detected by a detector for detecting a power supplied from the alternating-current power supply 1.

In addition, while the proportional-integral control is presented as the computation method used in the power supply current command value control unit 21 and the ON-duty control unit 22 in the example described above, the present invention is not limited to this computation method, and other computation methods may be used and a derivative term may be added to perform proportional-integral-derivative control. In addition, the computation methods in the power supply current command value control unit 21 and the ON-duty control unit 22 need not be the same computation method.

The description refers back to FIG. 13, in which the second pulse generating unit 25 generates pulse_321A that is a signal for driving the switching element 321 and pulse_322A that is a signal for driving the switching element 322 on the basis of the power supply voltage Vs detected by the power supply voltage detecting unit 5 and the power supply current Is detected by the power supply current detecting unit 6, and outputs the pulse_321A and the pulse_322A.

Figure 20:
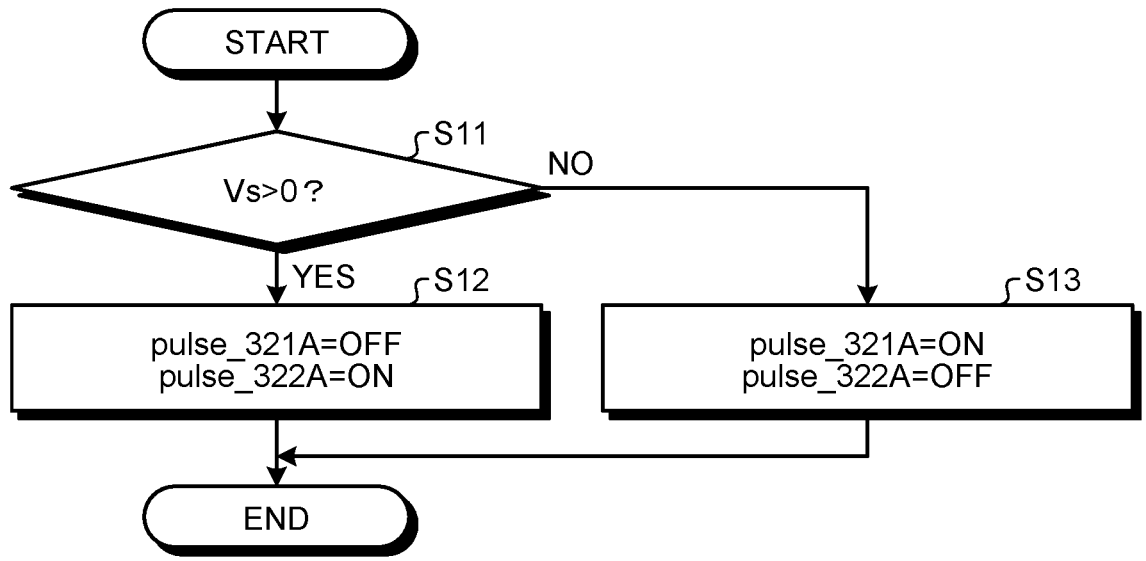
FIG. 20 is a flowchart illustrating an example of procedures of a process performed by a second pulse generating unit illustrated in FIG. 13.

FIG. 20 is a flowchart illustrating an example of procedures of a process performed by the second pulse generating unit illustrated in FIG. 13. A basic operation of the second pulse generating unit 25 is controlling the ON or OFF states of the switching element 321 and the switching element 322 depending on the polarity of the power supply voltage Vs. As illustrated in FIG. 20, the second pulse generating unit 25 determines whether or not the polarity of the power supply voltage Vs is positive, that is, Vs>0 (step S11). If the polarity of the power supply voltage Vs is positive (step S11: Yes), the second pulse generating unit 25 generates and outputs pulse_321A and pulse_322A to turn the switching element 321 OFF and turn the switching element 322 ON (step S12).

If the polarity of the power supply voltage Vs is negative (step S11: No), the second pulse generating unit 25 generates and outputs pulse_321A and pulse_322A to turn the switching element 321 ON and turn the switching element 322 OFF (step S13). This enables the synchronous rectification control, and a highly efficient system can be achieved as described above.

As described above, however, when the switching element 311 and the switching element 322 are turned ON while the power supply current Is is not flowing, a capacitor short circuit via the alternating-current power supply 1 and the reactor 2 occurs. Thus, in addition to control of the switching element 311 and the switching element 322, the power converting apparatus 100 according to the first embodiment controls the ON or OFF states of the switching element 321 and the switching element 322 on the basis of the power supply current Is.

Figure 21:
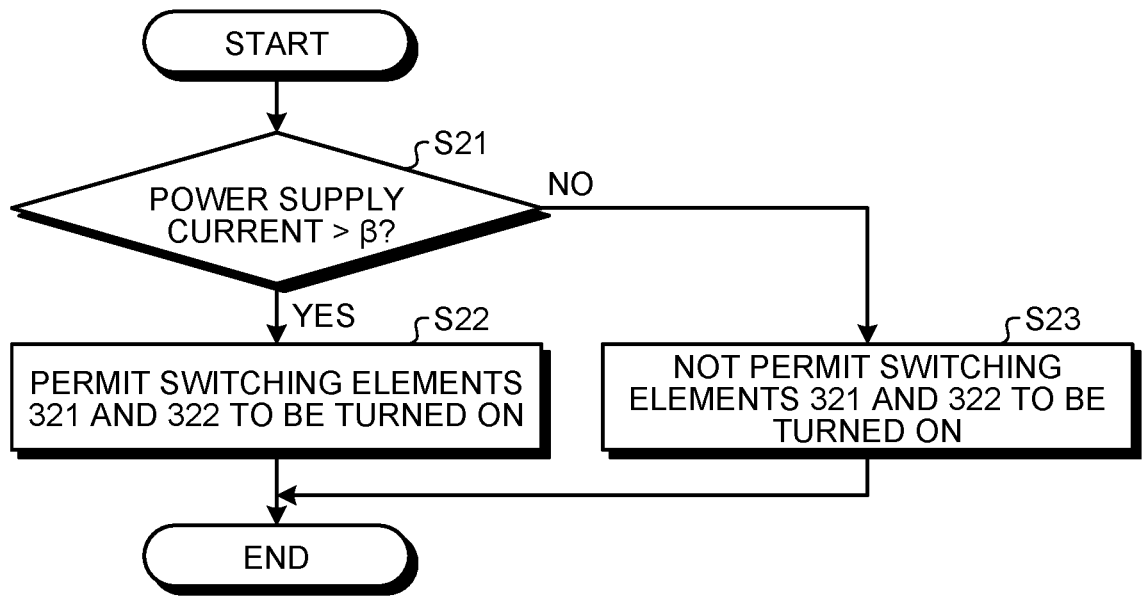
FIG. 21 is a flowchart illustrating an example of procedures for controlling the switching elements on the basis of the power supply current by the second pulse generating unit illustrated in FIG. 13.

FIG. 21 is a flowchart illustrating an example of procedures for controlling the switching elements on the basis of the power supply current by the second pulse generating unit illustrated in FIG. 13. As illustrated in FIG. 21, it is determined whether or not the absolute value of the power supply current Is is larger than the current threshold β (step S21). If the absolute value of the power supply current Is is larger than the current threshold β (step S21: Yes), the second pulse generating unit 25 permits the switching element 321 and the switching element 322 to be ON (step S22). When the switching element 321 and the switching element 322 are permitted to be ON, the ON and OFF states are controlled depending on the polarity of the power supply voltage Vs illustrated in FIG. 20.

If the absolute value of the power supply current Is is equal to or smaller than the current threshold β (step S21: No), the second pulse generating unit 25 does not permit the switching element 321 and the switching element 322 to be ON (step S23). When the switching element 321 and the switching element 322 are not permitted to be ON, the switching element 321 and the switching element 322 are controlled to be in the OFF state regardless of the polarity of the power supply voltage Vs illustrated in FIG. 20.

As a result of the control described above, when a current larger than the current threshold Q flows in the forward direction in the body diodes of the switching elements, the switching element 321 and the switching element 322 are turned ON. This enables prevention of a capacitor short circuit via the alternating-current power supply 1 and the reactor 2. In addition, the second pulse generating unit 25 may control the switching element 321 and the switching element 322 by using the polarity of the power supply current Is, that is, the direction in which the current flows, instead of ON-OFF control depending on the polarity of the power supply voltage Vs.

In addition, instead of the process illustrated in FIG. 21, whether or not to permit the switching element 321 and the switching element 322 to be ON may be determined on the basis of the state of switching control. When switching is not performed, no current flows in the switching elements, and thus a timing to enter such a state is predicted so as not to permit the switching element 321 and the switching element 322 to be ON. Note that, in this case, the synchronous rectification effect may not be produced in a state in which passive full-wave rectification, that is, a short-circuit path is not used, but control can be simply built independently of detection of a current or a voltage.

In addition, whether or not to permit the switching element 321 and the switching element 322 to be ON may be determined on the basis of a difference between the power supply voltage Vs and the bus voltage Vdc instead of the process illustrated in FIG. 21. Specifically, if (power supply voltage−bus voltage)>0, the switching element 321 and the switching element 322 are permitted to be ON, and if (power supply voltage−bus voltage)≤0, the switching element 321 and the switching element 322 are not permitted to be ON.

Note that, in the example described above, the second pulse generating unit 25 selects the switching element to be turned ON from the switching element 321 and the switching element 322 on the basis of the power supply voltage polarity, and controls switching element 321 and the switching element 322 on the basis of the power supply current Is to prevent a capacitor short circuit. The control, however, is not limited to this example, and the first pulse generating unit 24 may determine whether or not to permit the switching elements 311, 312, 321, and 322 to be ON on the basis of the power supply current Is to prevent a capacitor short circuit, and the second pulse generating unit 25 may perform switching depending on the power supply voltage polarity without performing control to prevent a capacitor short circuit on the switching element 321 and the switching element 322.

Specifically, in the case where the power supply voltage Vs is positive, the first pulse generating unit 24 does not permit the switching element 311 to be ON when the absolute value of the power supply current Is is equal to or smaller than the current threshold β, and permits the switching element 311 to be ON when the absolute value of the power supply current Is is larger than the current threshold β. In contrast, in the case where the power supply voltage Vs is negative, the first pulse generating unit 24 does not permit the switching element 312 to be ON when the absolute value of the power supply current Is is equal to or smaller than the current threshold β, and permits the switching element 312 to be ON when the absolute value of the power supply current Is is larger than the current threshold β.

In addition, while the switching in each of the arms in each power supply cycle is achieved by the method of generating complementary PWM signals in the example described above, the method of generating PWM signals is not limited to this example. Specifically, the control unit 10 may generate a signal pulse_312A for driving the switching element 312 when the power supply voltage Vs is positive, and generate a signal pulse_311A for driving the switching element 311 when the power supply voltage Vs is negative. In addition, in this case, the control unit 10 may generate PWM signals for driving the switching elements 311 and 312 on the basis of the relation of the power supply current Is, the power supply voltage Vs, and the bus voltage Vdc. This enables the switching elements 311 and 312 to be turned OFF before the timing at which the power supply current Is becomes zero, and in this case, a capacitor short circuit via the alternating-current power supply 1 and the reactor 2 can be prevented even when the operations of the switching elements 321 and 322 are controlled on the basis of the power supply voltage polarity.

Figure 22:
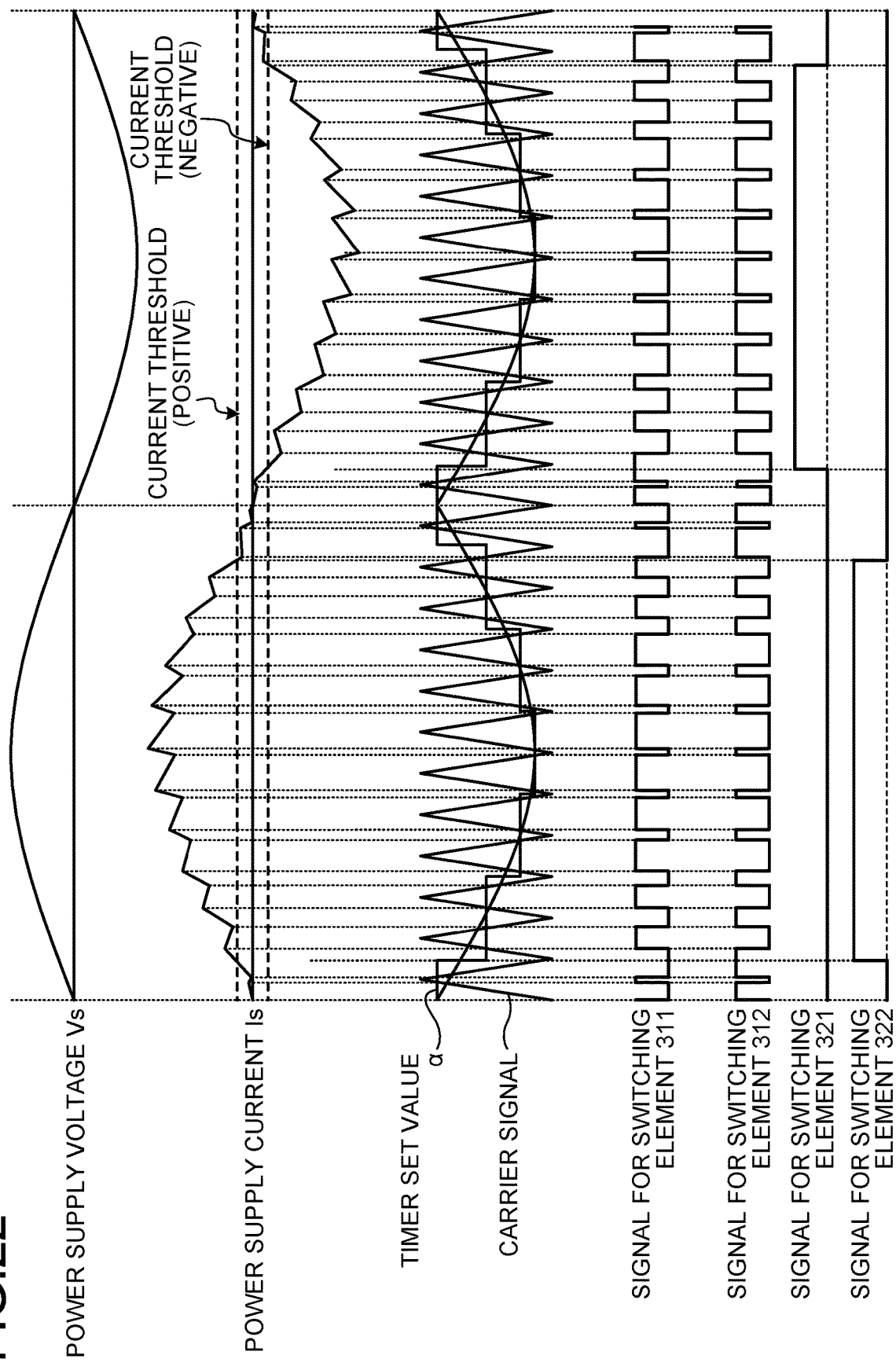
FIG. 22 is a chart illustrating a first example of signals, corresponding to one cycle of the power supply voltage, generated in the power converting apparatus according to the first embodiment.

FIG. 22 is a chart illustrating a first example of signals, corresponding to one cycle of the power supply voltage, generated in the power converting apparatus according to the first embodiment. FIG. 22 illustrates an example of the signals generated by the process explained with reference to FIG. 20. In FIG. 22, the horizontal axis represents time, and the power supply voltage Vs, the power supply current Is, a timer set value α and a carrier signal, a signal for driving the switching element 311, a signal for driving the switching element 312, a signal for driving the switching element 321, and a signal for driving the switching element 322 are illustrated in this order from the top.

The timer set value α is a command value associated with the reference ON-duty duty, and changes with time in a stepwise manner. The timer set value α is a period with the value of each step in the vertical axis being constant. The reference ON-duty duty associated with each timer set value α changing in such a stepwise manner is compared with the carrier wave carry that is the carrier signal, and the pulse widths of the switching elements 311 and 321 are thus determined. The reference ON-duty duty is small near the zero crossing of the power supply voltage Vs, and becomes larger as the power supply voltage Vs approaches its peak value. Note that the dead time is not illustrated in FIG. 22.

A current threshold (positive) on the positive side is set to prevent excessive switching operations near the zero crossing when the power supply current Is changes from negative to positive. Similarly, a current threshold (negative) on the negative side is set to prevent excessive switching operations near the zero crossing when the power supply current Is changes from positive to negative.

FIG. 22 illustrates an example of operations for complementarily performing PWM control on the switching elements 311 and 312, in which the switching element 312 is a master when the power supply voltage Vs has the positive polarity and the switching element 311 is a master when the power supply voltage Vs has the negative polarity. Thus, a reference ON-duty duty of an arc shape that is convex downward is used when the power supply voltage Vs has the positive polarity, and a reference ON-duty duty of an arc shape that is convex downward is also used when the power supply voltage Vs has the negative polarity.

The switching elements 321 and 322 are switched ON or OFF depending on the polarity of the power supply voltage Vs, and are further turned OFF when the absolute value of the power supply current Is is equal to or smaller than the current threshold. Note that the power converting apparatus 100 according to the first embodiment may have a configuration in which the power supply current detecting unit 6 has a filter or hysteresis to prevent excessive switching operations near the current thresholds. Alternatively, the power converting apparatus 100 according to the first embodiment may have a configuration in which the control unit 10 has a filter to the power supply current Is or hysteresis to prevent excessive switching operations near the current thresholds.

Figure 23:
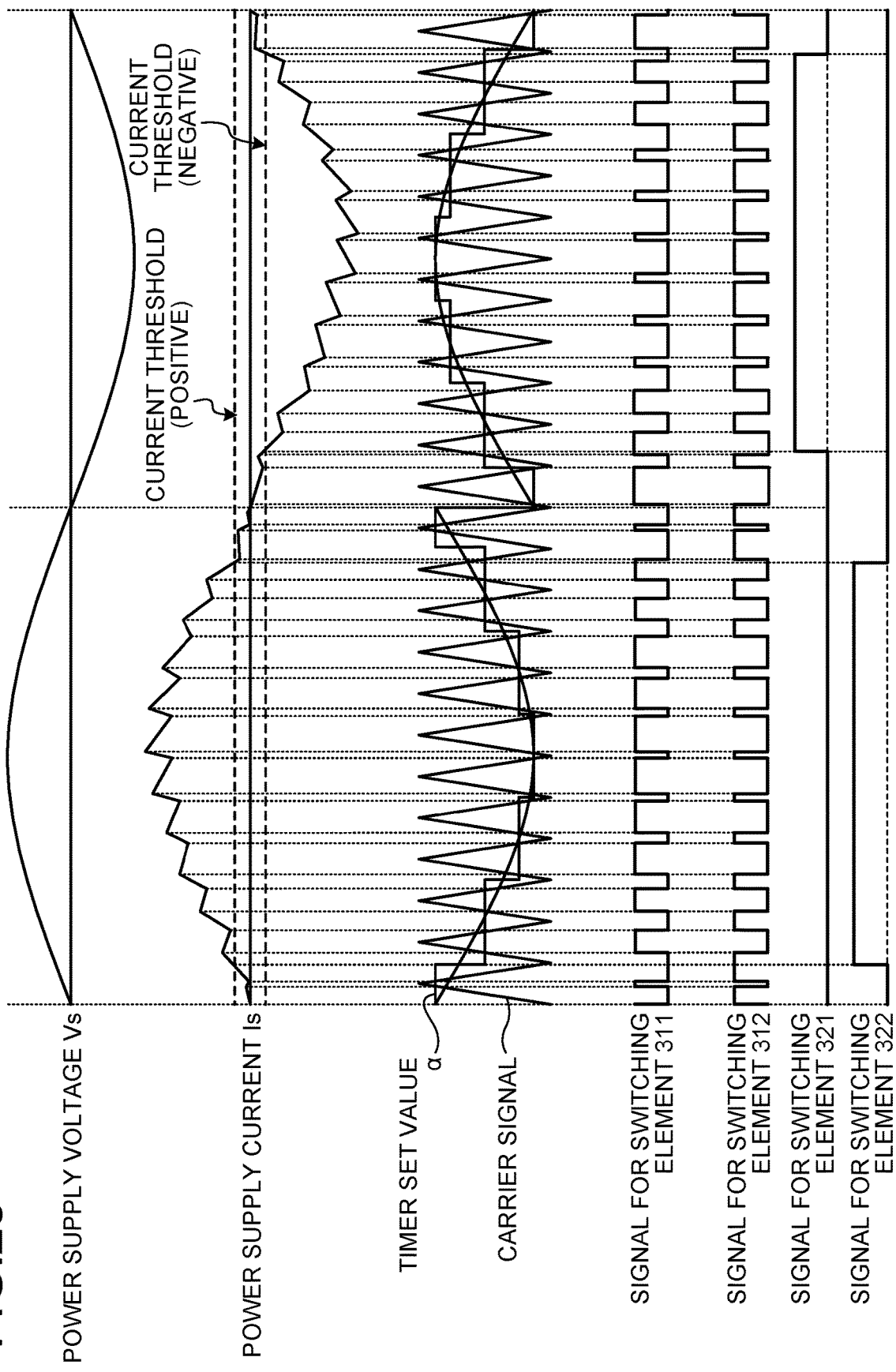
FIG. 23 is a chart illustrating a second example of signals, corresponding to one cycle of the power supply voltage, generated in the power converting apparatus according to the first embodiment.

FIG. 23 is a chart illustrating a second example of signals, corresponding to one cycle of the power supply voltage, generated in the power converting apparatus according to the first embodiment. In FIG. 23, in a manner similar to FIG. 22, the horizontal axis represents time, and the power supply voltage Vs, the power supply current Is, the timer set value α and the carrier signal, a signal for driving the switching element 311, a signal for driving the switching element 312, a signal for driving the switching element 321, and a signal for driving the switching element 322 are illustrated in this order from the top.

FIG. 23 illustrates an example of operations for complementarily performing PWM control on the switching elements 311 and 312, in which the switching element 312 is a master when the power supply voltage Vs has the positive polarity and when the power supply voltage Vs has the negative polarity. Thus, a reference ON-duty duty of an arc shape that is convex downward is used when the power supply voltage Vs has the positive polarity, and a reference ON-duty duty of an arc shape that is convex upward is used when the power supply voltage Vs has the negative polarity. In the example of the operations in FIG. 23, the signal pulse_312A for driving the switching element 312 is generated when the power supply voltage Vs has the positive polarity, and the signal pulse_311A for driving the switching element 311 is generated when the power supply voltage Vs has the negative polarity.

Figure 24:
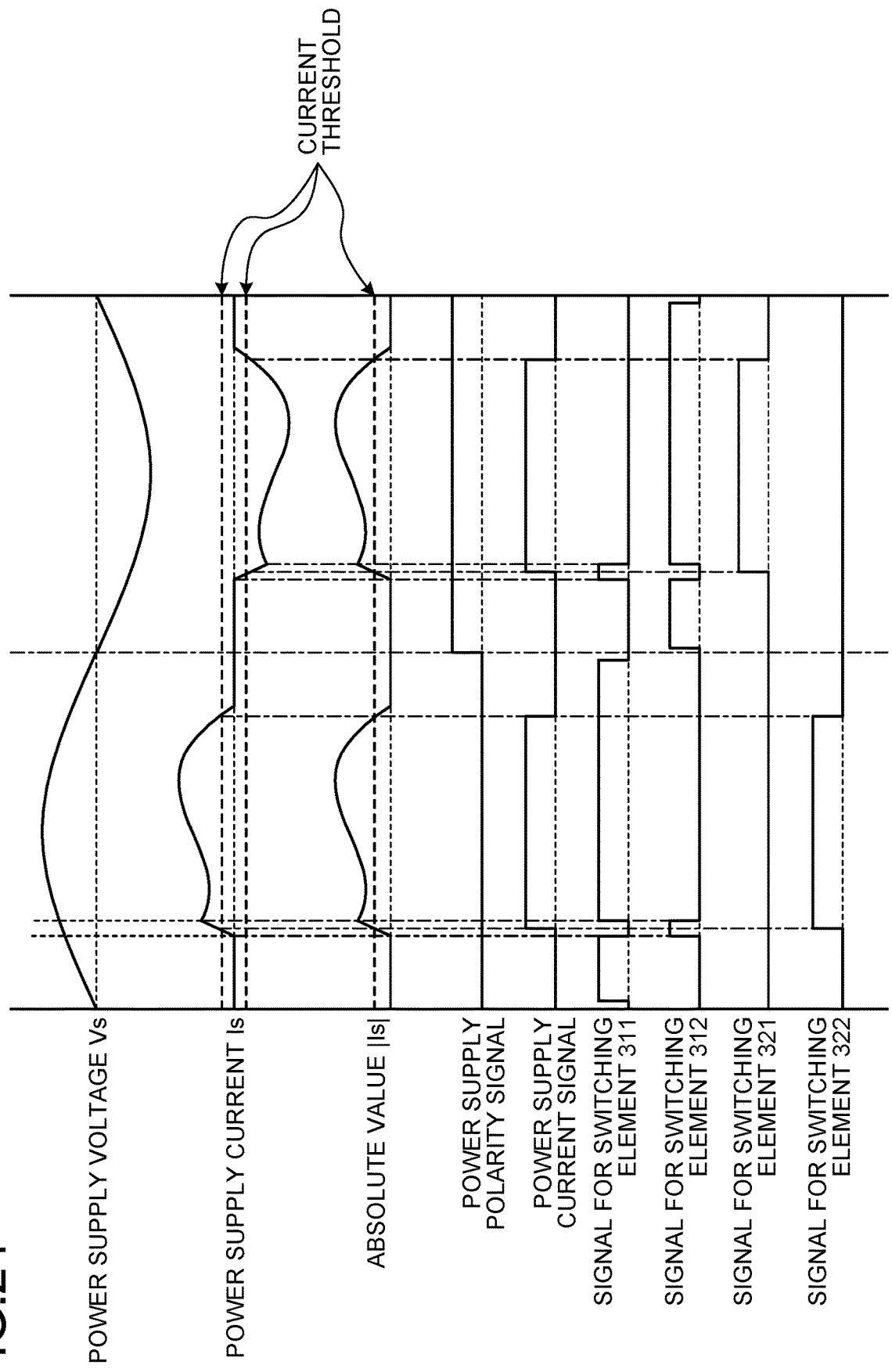
FIG. 24 is a chart illustrating an example of signals when the power converting apparatus according to the first embodiment performs simple switching control.

In addition, while the example in which the switching elements are controlled by the carrier signals is presented in FIG. 22 described above, the operations of the first embodiment are also applicable to simple switching control in which switching is performed once to several times during a half cycle of the power supply cycle. FIG. 24 is a chart illustrating an example of signals when the power converting apparatus according to the first embodiment performs simple switching control. In FIG. 24, the horizontal axis represents time, and the power supply voltage Vs, the power supply current Is, the absolute value Is of the power supply current Is, a power supply polarity signal, a power supply current signal, a signal for driving the switching element 311, a signal for driving the switching element 312, a signal for driving the switching element 321, and a signal for driving the switching element 322 are illustrated in this order from the top. The power supply polarity signal is a binary signal that changes with the polarity of the power supply voltage Vs, and is used for controlling the switching element operations of the switching elements 311 and 312. The power supply current signal is a binary signal used for controlling the switching element operations of the switching elements 321 and 322.

In FIG. 24, three current thresholds are illustrated. A current threshold on the positive side of the power supply current Is is a threshold set for a purpose similar to that of the current threshold (positive) on the positive side described with reference to FIG. 22. A current threshold on the negative side of the power supply current Is is a threshold set for a purpose similar to that of the current threshold (negative) on the negative side described with reference to FIG. 22. A current threshold set for the absolute value |Is| of the power supply current Is is a threshold set for changing the value of the power supply current signal.

The power supply polarity signal is generated by detection of the zero crossing of the power supply voltage Vs, and the power supply current signal is generated by detection of the zero crossing of the power supply current Is. In this case, when the absolute value |Is| of the power supply current Is is equal to or smaller than the current threshold, the power converting apparatus 100 performs control such that the switching element 311 and the switching element 321 are not ON at the same time and such that the switching element 312 and the switching element 322 are not ON at the same time. This enables prevention of a capacitor short circuit.

In addition, even when the switching elements 311 and 312 are in a passive state in which no switching operations are performed, the switching element 321 and the switching element 322 are prevented from being turned ON when the absolute value of the power supply current Is is equal to or smaller than the current threshold, which enables prevention of a capacitor short circuit.

Figure 25:
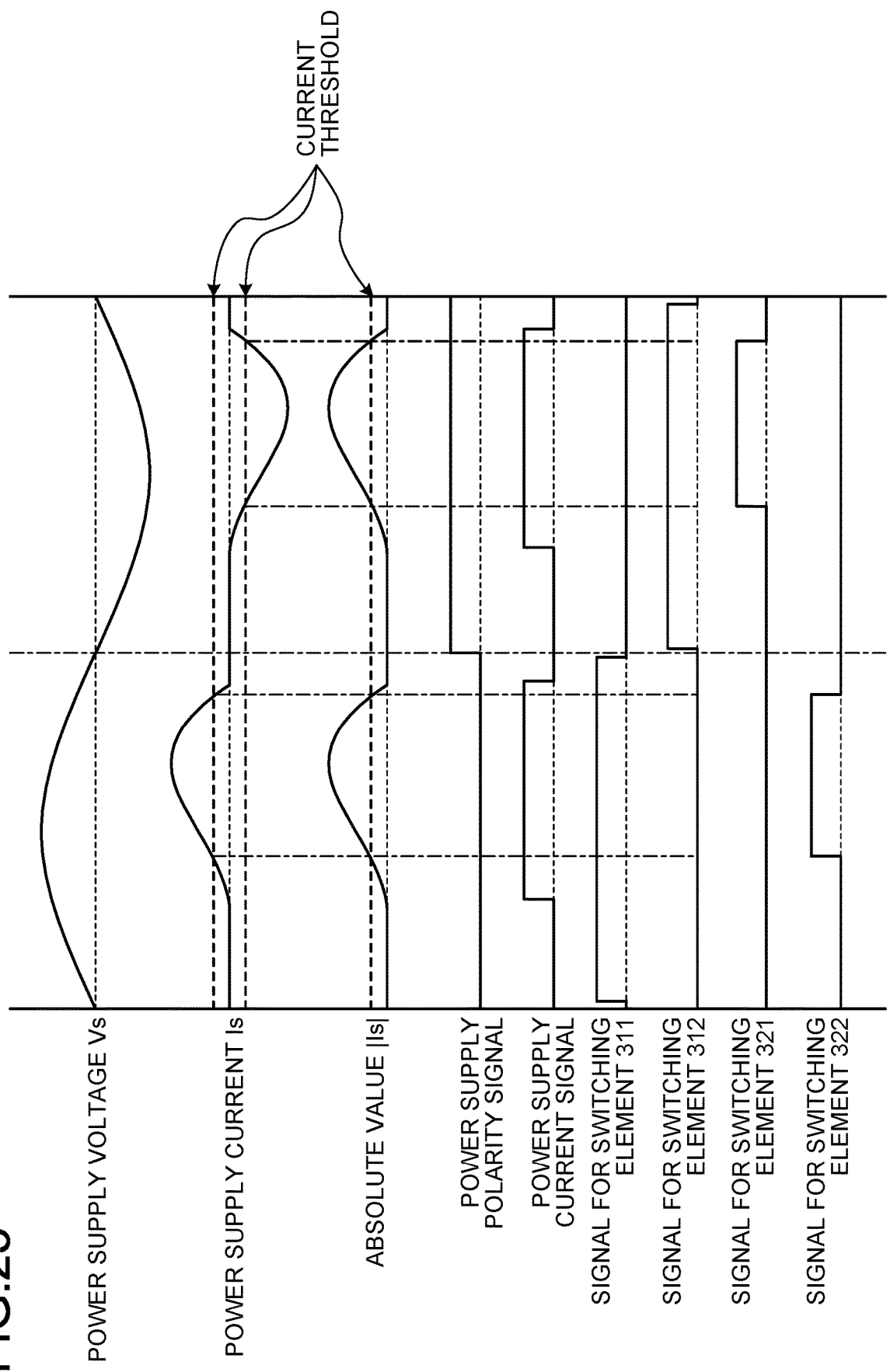
FIG. 25 is a chart illustrating an example of signals in passive states generated by the power converting apparatus according to the first embodiment.

FIG. 25 is a chart illustrating an example of signals in passive states generated by the power converting apparatus according to the first embodiment. In FIG. 25, in a manner similar to FIG. 24, the horizontal axis represents time, and the power supply voltage Vs, the power supply current Is, the absolute value |Is| of the power supply current Is, a power supply polarity signal, a power supply current signal, a signal for driving the switching element 311, a signal for driving the switching element 312, a signal for driving the switching element 321, and a signal for driving the switching element 322 are illustrated in this order from the top. In this case as well, when the absolute value of the power supply current Is equal to or smaller than the current threshold, the power converting apparatus 100 performs control such that the switching element 311 and the switching element 321 are not ON at the same time and such that the switching element 312 and the switching element 322 are not ON at the same time. This enables prevention of a capacitor short circuit.

Next, driving circuits and bootstrap circuits for the switching elements will be described with reference to FIGS. 26 to 29.

Figure 26:
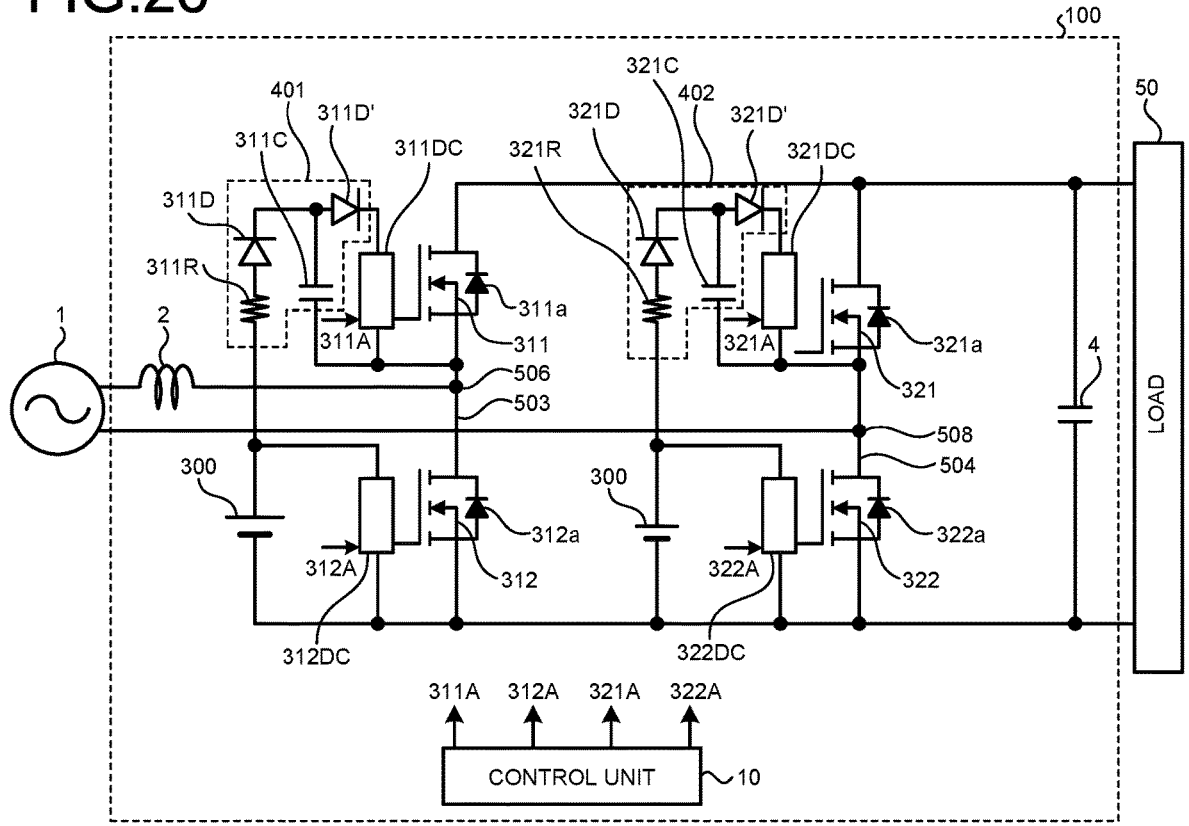
FIG. 26 is a diagram illustrating driving circuits and bootstrap circuits included in the power converting apparatus according to the first embodiment.

FIG. 26 is a diagram illustrating driving circuits and bootstrap circuits included in the power converting apparatus according to the first embodiment. As illustrated in FIG. 26, the power converting apparatus 100 includes two direct-current voltage sources 300, four driving circuits 311DC, 312DC, 321DC, and 322DC, and two bootstrap circuits 401 and 402, in addition to the configuration illustrated in FIG. 1. While the driving circuits 311DC and 312DC share one direct-current voltage source 300 and the driving circuits 321DC and 322DC share the other direct-current voltage source 300 in the power converting apparatus 100 of FIG. 26, one direct-current voltage source 300 may be used instead of the two direct-current voltage sources 300, and the four driving circuits 311DC, 312DC, 321DC, and 322DC may share the one direct-current voltage source 300.

The driving circuit 311DC that is a first driving circuit converts pulse_311A from the control unit 10 into a first driving signal for driving the switching element 311 by using a voltage output from the bootstrap circuit 401 as the power supply voltage, and outputs the first driving signal to the gate of the switching element 311. Details of the configuration of the bootstrap circuit 401 will be described later. The driving circuit 312DC that is a second driving circuit converts pulse_312A from the control unit 10 into a second driving signal for driving the switching element 312 by using a voltage output from the direct-current voltage source 300 as the power supply voltage, and outputs the second driving signal to the gate of the switching element 312.

The driving circuit 321DC converts pulse_321A from the control unit 10 into a driving signal for driving the switching element 321 by using a voltage from the bootstrap circuit 402 as the power supply voltage, and outputs the driving signal to the gate of the switching element 321. The driving circuit 322DC converts pulse_322A from the control unit 10 into a driving signal for driving the switching element 322 by using a voltage output from the direct-current voltage source 300 as the power supply voltage, and outputs the driving signal to the gate of the switching element 322.

The bootstrap circuit 401 includes a boot resistor 311R having one end connected to the direct-current voltage source 300, a boot diode 311D having an anode connected to the other end of the boot resistor 311R, a boot capacitor 311C that is a second capacitor having one end connected to a cathode of the boot diode 311D and the other end connected to the driving circuit 311DC, and a gate voltage suppression diode 311D'.

An anode of the gate voltage suppression diode 311D' is connected to the cathode of the boot diode 311D and one end of the boot capacitor 311C. A cathode of the gate voltage suppression diode 311D' is connected to the driving circuit 311DC. Assume that the value of a first voltage that is a voltage at which a forward current starts to flow in the gate voltage suppression diode 311D' is lower than the value of a second voltage that is a voltage at which a forward current starts to flow in the body diode 312a. Thus, assume that the forward current-forward voltage characteristics of the gate voltage suppression diode 311D' are superior to the forward current-forward voltage characteristics of the body diode 312a. Note that, a voltage at which a forward current starts to flow in a diode is typically called a forward voltage.

The bootstrap circuit 402 has a configuration similar to that of the bootstrap circuit 401, and includes a boot resistor 321R having one end connected to the direct-current voltage source 300, a boot diode 321D having an anode connected to the other end of the boot resistor 321R, a boot capacitor 321C having one end connected to a cathode of the boot diode 321D and the other end connected to the driving circuit 321DC, and a gate voltage suppression diode 321D'.

An anode of the gate voltage suppression diode 321D' is connected to the cathode of the boot diode 321D and one end of the boot capacitor 321C. A cathode of the gate voltage suppression diode 321D' is connected to the driving circuit 321DC. Assume that the value of a voltage at which a forward current starts to flow in the gate voltage suppression diode 321D' is lower than the value of a voltage at which a forward current starts to flow in the body diode 322a. Thus, assume that the forward current-forward voltage characteristics of the gate voltage suppression diode 321D' are superior to the forward current-forward voltage characteristics of the body diode 322a. The reason why the gate voltage suppression diode 311D' is used will be described later. Note that, because the bootstrap circuit 402 has a configuration similar to that of the bootstrap circuit 401, details of the configuration of the bootstrap circuit 402 will not be described.

In the bootstrap circuit 401 having such a configuration, when the switching element 312 is turned ON, a current flows through a path constituted by the direct-current voltage source 300, the boot resistor 311R, the boot diode 311D, the boot capacitor 311C, and the switching element 312, and the boot capacitor 311C is charged. A capacitor voltage $V_c$ generated across the ends of the charged boot capacitor 311C can be expressed as $V_c = V_{dc} + V_{BD} - V_{dr} - V_f$. $V_{dc}$ represents the voltage of the direct-current voltage sources 300, $V_{BD}$ represents the forward voltage of the body diode 312a, $V_{dr}$ represents a drop voltage of the boot resistor 311R, and $V_f$ represents the forward voltage of the boot diode 311D.

For example, when $V_{dc}$ is 6.0 V, $V_{BD}$ is 3.0 V, $V_{dr}$ is 0.5 V, and $V_f$ is 1.5 V, $V_c$ is 7.0 V. In this case, when the rated voltage of the driving circuit 311DC is 6.0 V, the value of $V_c$ is higher than the rated voltage of the driving circuit 311DC. The reason why the value of $V_c$ is high is that the forward voltage of the body diode 312a is also applied to the boot capacitor 311C in addition to the voltage of the direct-current voltage source 300. The forward voltage of the body diode 312a is a voltage at which a forward current starts to flow in the body diode 312a. For example, in a case where a switching element made of a WBG semiconductor in which the potential barrier of a p-n junction is high is used as the switching element 312, the forward voltage of the body diode 312a of the switching element 312 tends to be high. Note that the switching element 312 in which the forward voltage of the body diode 312a becomes high is not limited to a switching element made of a WBG semiconductor, and a Si switching element in which the forward voltage of a body diode tends to be high so that the capacitor voltage $V_c$ of the boot capacitor 311C is higher than the rated voltage of the driving circuit 311DC may also be applicable.

When the capacitor voltage $V_c$ becomes higher than the rated voltage of the driving circuit 311DC, the withstand voltage of the driving circuit 311DC may decrease. In addition, because the value of the driving signal generated by the driving circuit 311DC becomes larger, the short circuit withstand of the switching element 311 may decrease. In addition, when the switching element 311 is driven by the driving circuit 311DC to which such a high voltage is applied, the value of the driving signal generated by the driving circuit 311DC becomes larger than the value of the driving signal generated by the driving circuit 312DC to which the voltage of the direct-current voltage source 300 is applied. Thus, the value of the loss of the switching element 311 in the ON state and the value of the loss of the switching element 312 in the ON state are different from each other, and imbalance in heat generation between the switching element 311 and the switching element 312 increases. When the imbalance in heat generation increases and a junction temperature of a semiconductor constituting one of the switching elements exceeds a permissible value, there is a possibility that normal operations can no longer be performed.

In the power converting apparatus 100 illustrated in FIG. 26, the gate voltage suppression diode 311D' is provided between the boot capacitor 311C and the driving circuit 311DC. In other words, the boot capacitor 311C is connected with the driving circuit 311DC via the gate voltage suppression diode 311D'. Thus, the capacitor voltage of the boot capacitor 311C is reduced by a certain value by the gate voltage suppression diode 311D', and then applied as the power supply voltage for the driving circuit 311DC to the driving circuit 311DC. In this manner, the gate voltage suppression diode 311D' functions as a power supply voltage adjusting element for adjusting the power supply voltage for the driving circuit 311DC to be applied from the boot capacitor 311C to the driving circuit 311DC.

For example, when $V_{dc}$ is 6.0 V, $V_{BD}$ is 3.0 V, $V_{dr}$ is 0.5 V, $V_f$ is 1.5 V, and $V_D$ is 1.0 V, the value of $V_c$ is expressed as $V_c = V_{dc} + V_{BD} - V_{dr} - V_f - V_D$ and $V_c = 6.0$ V is obtained. $V_D$ represents a forward voltage of the gate voltage suppression diode 311D', that is, a voltage at which a forward current starts to flow in the gate voltage suppression diode 311D'.

As described above, while a driving voltage equal to $V_c$ (7.0 V) is applied to the driving circuit 311DC when the gate voltage suppression diode 311D' is not provided, 6.0 V is applied to the driving circuit 311DC when the gate voltage suppression diode 311D' is provided. Thus, as a result of providing the gate voltage suppression diode 311D', the power supply voltage for the driving circuit 311DC to be applied from the boot capacitor 311C to the driving circuit 311DC can be reduced to the rated voltage of the driving circuit 311DC. In addition, when $V_{dc}$, $V_{BD}$, $V_{dr}$, $V_f$, $V_D$, etc. are set as described above, the power supply voltage for the driving circuit 311DC becomes equal to the voltage $V_{dc}$ of the direct-current voltage source 300.

According to the power converting apparatus 100 according to the first embodiment, a decrease in the withstand voltage of the driving circuit 311DC can be prevented or reduced, and a decrease in the short circuit withstand of the switching element 311 can be prevented or reduced. In addition, because the power supply voltage for the driving circuit 311DC can be adjusted to a value equal to the power supply voltage for the driving circuit 312DC, the imbalance in heat generation between the switching element 311 and the switching element 312 can be reduced, which improves the reliability of the power converting apparatus 100.

In addition, according to the power converting apparatus 100 according to the first embodiment, because the power supply voltage for the driving circuit 311DC can be adjusted to a value equal to the power supply voltage for the driving circuit 312DC, the driving circuit 311DC and the driving circuit 312DC can be constituted by common components. This improves the yield of components as compared with a case where the driving circuit 311DC and the driving circuit 312DC are produced from different components. In addition, the manufacturing cost of the driving circuit 311DC and the driving circuit 312DC is reduced, and the volume of the components during manufacture of the driving circuit 311DC and the driving circuit 312DC can be reduced. Furthermore, replacement of the driving circuit 311DC and the driving circuit 312DC in repairing the power converting apparatus 100 is facilitated.

Note that, while the gate voltage suppression diode 311D' is provided inside the bootstrap circuit 401 in the power converting apparatus 100 illustrated in FIG. 26, the gate voltage suppression diode 311D' may be produced separately from the bootstrap circuit 401 and provided between the bootstrap circuit 401 and the driving circuit 311DC. In the case where the gate voltage suppression diode 311D' is provided inside the bootstrap circuit 401, the bootstrap circuit 401 can be manufactured such that the gate voltage suppression diode 311D', the boot capacitor 311C, and the like are formed integrally. This improves the production efficiency of the power converting apparatus 100. In the case where the gate voltage suppression diode 311D' is produced separately from the bootstrap circuit 401 and provided between the bootstrap circuit 401 and the driving circuit 311DC, a suitable gate voltage suppression diode 311D' according to the value of the forward voltage of the body diode 312a can be selected from a plurality of gate voltage suppression diodes 311D' with different forward voltages and can be mounted. This enables the power supply voltage for the driving circuit 311DC to be easily adjusted.

Figure 27:
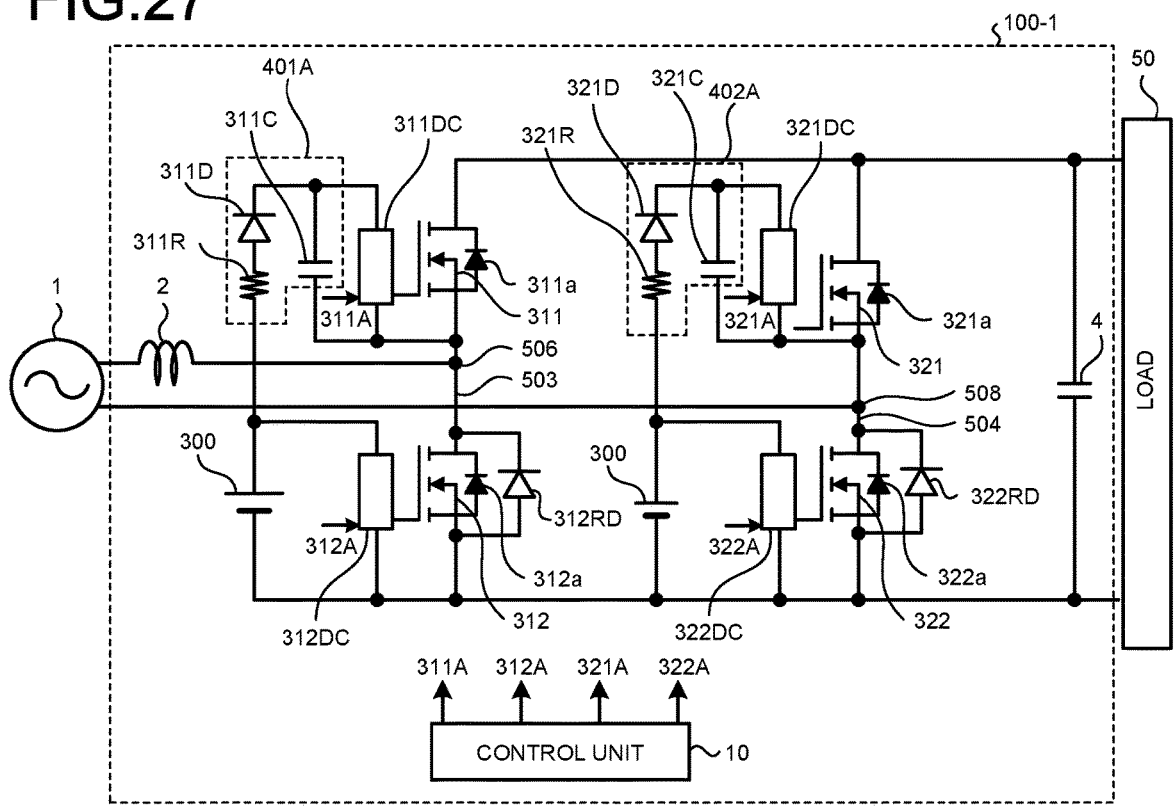
FIG. 27 is a diagram illustrating an example of a configuration of a power converting apparatus according to a first modification of the first embodiment.

FIG. 27 is a diagram illustrating an example of a configuration of a power converting apparatus according to a first modification of the first embodiment. In a power converting apparatus 100-1 illustrated in FIG. 27, bootstrap circuits 401A and 402A are used instead of the bootstrap circuits 401 and 402 illustrated in FIG. 26. In the bootstrap circuit 401A, the gate voltage suppression diode 311D' is not provided, and one end of the boot capacitor 311C is directly connected to the driving circuit 311DC. In the bootstrap circuit 402A, the gate voltage suppression diode 321D' is not provided, and one end of the boot capacitor 321C is directly connected to the driving circuit 321DC. In addition, in the power converting apparatus 100-1, a gate voltage suppression diode 312RD is connected in parallel with the switching element 312, and a gate voltage suppression diode 322RD is connected in parallel with the switching element 322.

An anode of the gate voltage suppression diode 312RD is connected to an anode of the body diode 312a, and a cathode of the gate voltage suppression diode 312RD is connected to a cathode of the body diode 312a. Assume that the forward current-forward voltage characteristics of the gate voltage suppression diode 312RD are superior to the forward current-forward voltage characteristics of the body diode 312a. For example, when the forward voltage of the gate voltage suppression diode 312RD is 1.5 V and the forward voltage of the body diode 312a is 3.0 V, the boot capacitor 311C is charged by a voltage having a value obtained by subtracting the drop voltage of the boot resistor 311R and the forward voltage of the boot diode 311D from a sum of 1.5 V and the voltage of the direct-current voltage source 300. The capacitor voltage of the charged boot capacitor 311C has a value smaller than that in the case where no gate voltage suppression diode 312RD is used, and is used as the power supply voltage for the driving circuit 311DC. As described above, the gate voltage suppression diode 312RD functions as a capacitor voltage adjusting element for adjusting a capacitor voltage generated across the ends of the boot capacitor 311C.

An anode of the gate voltage suppression diode 322RD is connected to an anode of the body diode 322a, and a cathode of the gate voltage suppression diode 322RD is connected to a cathode of the body diode 322a. Assume that the forward current-forward voltage characteristics of the gate voltage suppression diode 322RD are superior to the forward current-forward voltage characteristics of the body diode 322a. The gate voltage suppression diode 322RD functions as a capacitor voltage adjusting element for adjusting the capacitor voltage generated across the ends of the boot capacitor 321C.

According to the power converting apparatus 100-1 illustrated in FIG. 27, an increase in the charging voltage of the boot capacitor can be prevented or reduced, and an increase in the loss due to the body diode during an asynchronous rectification period of the zero crossing and the dead time can be prevented or reduced.

Figure 28:
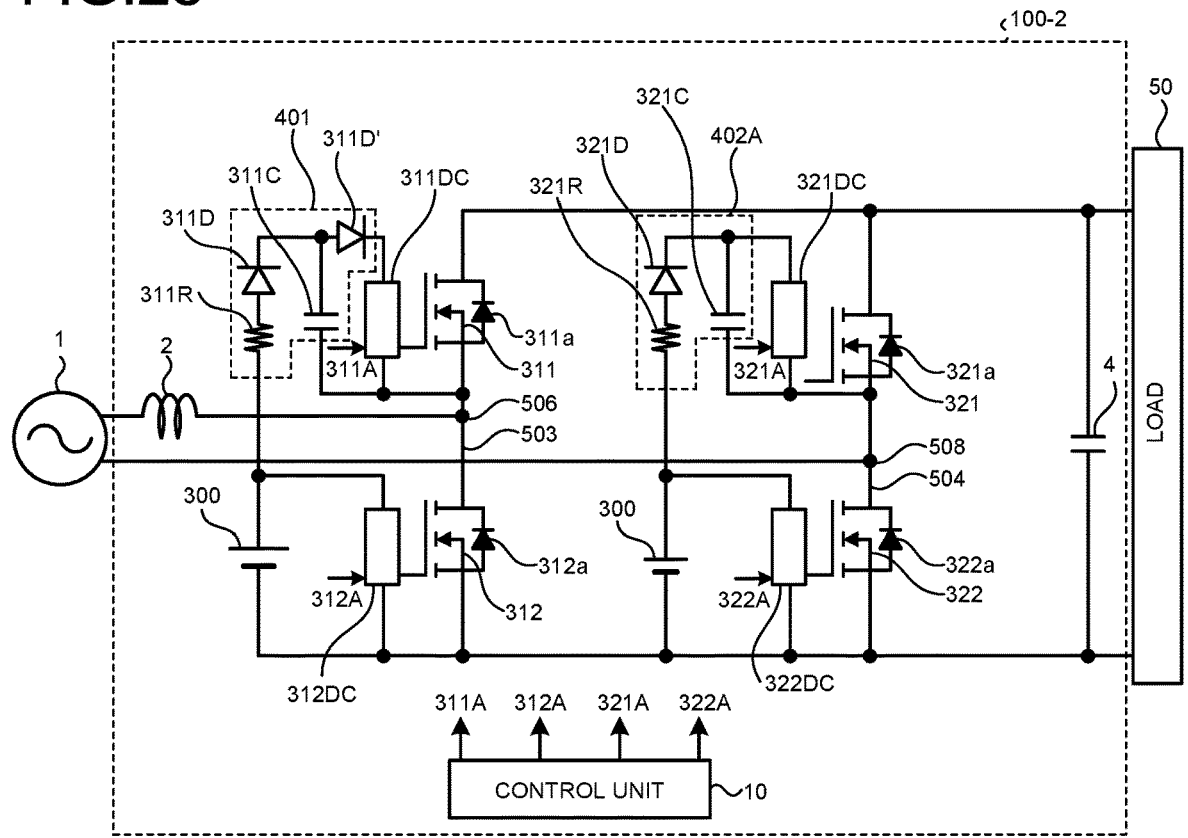
FIG. 28 is a diagram illustrating an example of a configuration of a power converting apparatus according to a second modification of the first embodiment.

FIG. 28 is a diagram illustrating an example of a configuration of a power converting apparatus according to a second modification of the first embodiment. In a power converting apparatus 100-2 illustrated in FIG. 28, the bootstrap circuit 402A illustrated in FIG. 27 is used instead of the bootstrap circuit 402 illustrated in FIG. 26. Thus, in the power converting apparatus 100-2, the gate voltage suppression diode 311D' is used only in the first arm.

In a power converting apparatus having a full-bridge configuration like the power converting apparatus 100-2, no path for charging the boot capacitor via the body diode occurs by synchronous rectification control based on the power supply polarities of the switching elements 321 and 322. Thus, in the power converting apparatus 100-2, the gate voltage suppression diode 311D' may be implemented only in the first arm, which enables reduction in used components.

Figure 29:
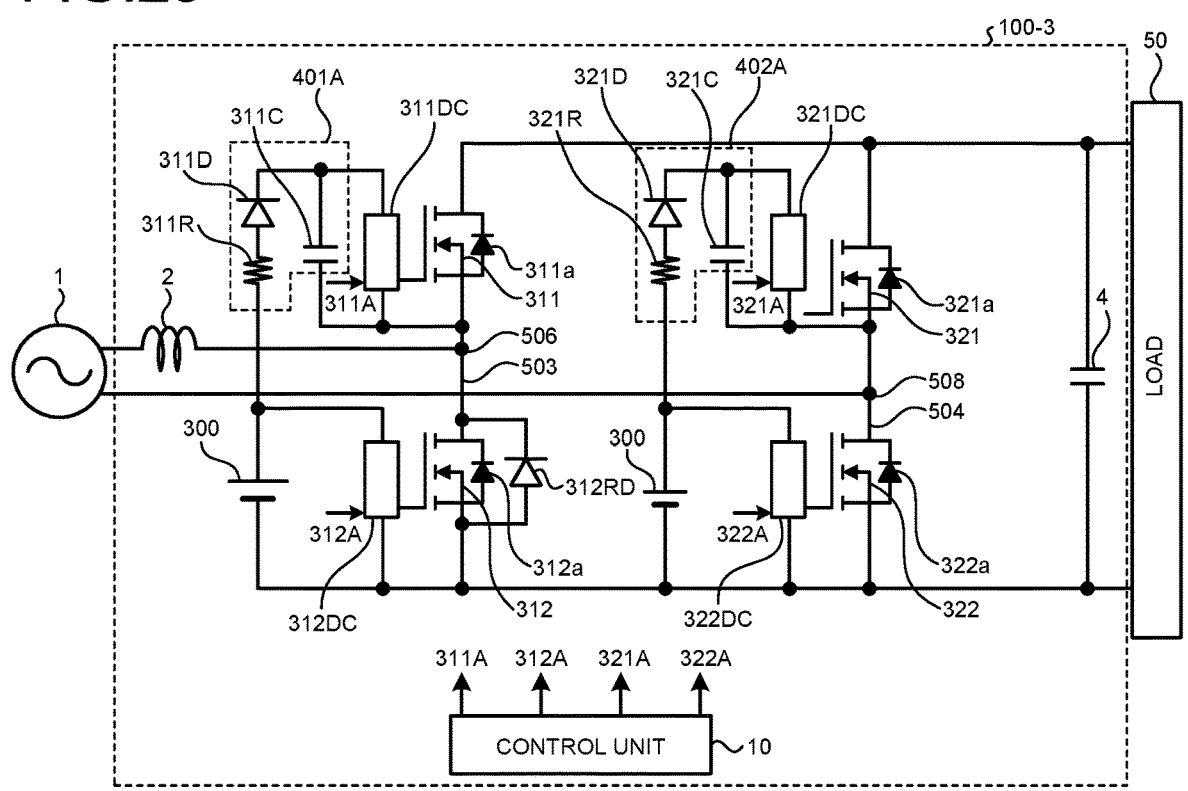
FIG. 29 is a diagram illustrating an example of a configuration of a power converting apparatus according to a third modification of the first embodiment.

FIG. 29 is a diagram illustrating an example of a configuration of a power converting apparatus according to a third modification of the first embodiment. In a power converting apparatus 100-3 illustrated in FIG. 29, the gate voltage suppression diode 322RD illustrated in FIG. 27 is not provided. Thus, in the power converting apparatus 100-3, the gate voltage suppression diode 312RD is used only in the first arm. In the power converting apparatus 100-3, in a manner similar to the power converting apparatus 100-2, no path for charging the boot capacitor via the body diode occurs by synchronous rectification control based on the power supply polarities of the switching elements 321 and 322. Thus, in the power converting apparatus 100-3, the gate voltage suppression diode 312RD may be implemented only in the first arm, which enables reduction in used components.

Note that, in the first embodiment, in a case where the alternating-current power supply 1 is a commercial power supply of 50 Hz or 60 Hz, the audible frequency is in a range from 16 kHz to 20 kHz, that is, a range from 266 to 400 times the frequency of the commercial power supply. When the switching elements are driven with such audible frequency, there is a problem of noise caused by switching. Because switching elements made of WBG semiconductors can perform fast switching, switching elements made of WBG semiconductors are suitable for switching elements that can be switched at a frequency higher than such audible frequency, such as a switching frequency higher than 20 kHz.

In addition, in a case where switching elements made of Si semiconductors are driven at a switching frequency of several tens of kHz or higher, such as a switching frequency higher than 20 kHz, the ratio of the switching loss increases, and a measure for heat radiation is essential. In the case of switching elements made of WBG semiconductors, the switching loss is much smaller than that in the case of switching elements made of Si semiconductors even when the switching elements are driven at a switching frequency higher than 20 kHz. Thus, use of switching elements made of WBG semiconductors in the power converting apparatus 100 eliminates the need for a measure for heat radiation of switching elements or allows miniaturization of members, such as radiating fins, used for a measure for heat radiation of switching elements, which enables reduction in size and weight of the power converting apparatus 100. In addition, high-frequency switching of switching elements made of WBG semiconductors can be performed, which can make the inductance of the reactor 2 relatively smaller. Thus, the reactor 2 can be reduced in size. Note that the switching frequency is preferably equal to or lower than 150 kHz so that the primary component of the switching frequency is not included in a range of measurement of noise terminal voltage standard.

In addition, WBG semiconductors have a smaller capacitance than Si semiconductors; therefore, a recovery current caused by switching is low and the occurrence of a loss and noise caused by a recovery current can thus be reduced. Thus, WBG semiconductors are suitable for high-frequency switching.

In addition, even in a case where WBG semiconductors are driven at a high frequency about 100 kHz, an increase in a loss generated in the switching elements is prevented or reduced; therefore, the loss reduction effect produced by miniaturization of the reactor 2 increases. Thus, a highly efficient converter can be achieved in a wide output band, that is, under a wide load condition.

In addition, WBG semiconductors have a higher heat resistance than Si semiconductors, and have a higher permissible level of heat generation by switching due to imbalance in the loss between arms. Because the first arm 31 is driven at a higher frequency than the second arm 32 and the switching loss and the heat generation of the first arm 31 thus increase, WBG semiconductors are more suitable for the first arm 31 with high heat generation than the second arm 32.

Note that super junction (SJ)-MOSFETs may be used for switching elements constituting an arm that performs slow switching. Use of SJ-MOSFETs for an arm that performs slow switching can reduce the disadvantages of SJ-MOSFETs, which are high capacitance and high occurrence of recovery, while making use of low ON-resistance that is an advantage of SJ-MOSFETs. In addition, use of SJ-MOSFETs can reduce the manufacturing cost of the arm that performs slow switching as compared to use of switching elements made of WBG semiconductors.

Note that the power converting apparatus 100 according to the first embodiment may be constituted by a general-purpose intelligent power module (IPM). Use of an IPM enables the driving circuits for the switching elements 311, 312, 321, and 322 to be contained inside the IPM, which can reduce the board area on which the reactor 2, the bridge circuit 3, the smoothing capacitor 4, the power supply voltage detecting unit 5, the power supply current detecting unit 6, the bus voltage detecting unit 7, and the control unit 10 are mounted. In addition, use of a general-purpose IPM can prevent or reduce an increase in cost.

Note that the power converting apparatus 100 according to the first embodiment only needs to obtain the polarity of the power supply voltage Vs, and is not limited to the configuration for determining the polarity of the power supply voltage Vs by detecting a zero crossing point of the power supply voltage Vs. In the case of detecting a zero crossing point, in order to prevent erroneous determination of the polarity near the zero crossing, the power converting apparatus 100 turns the operations of the first arm 31 and the second arm 32 OFF for a predetermined period from the zero crossing point on the basis of the power supply voltage phase estimation value $\hat{\theta}_s$.

While the switching element 321 and the switching element 322 are permitted to be in the ON state when the absolute value of the power supply current Is is equal to or larger than the current threshold in the power converting apparatus 100 according to the first embodiment, the configuration of the power converting apparatus 100 is not limited thereto. The power converting apparatus 100 may estimate that a current flows in a body diode of a switching element by using any of the power supply voltage Vs, a voltage applied to the first arm 31, the bus voltage Vdc, and a voltage applied across the ends of the switching element to control the switching element 321 and the switching element 322. In the case of estimating that a current flows in a body diode of a switching element by using any of the power supply voltage Vs, the voltage applied to the first arm 31, and the bus voltage Vdc, there are many factors of variation in determination and thus attention should be given to estimation error. In addition, in the case of estimating that a current flows in a body diode of a switching element by using the voltage applied across the switching element, a voltage detecting circuit is required for each of the switching elements for which a current flow is to be estimated.

While the example in which the synchronous rectification control is performed by detecting the power supply current Is is described in the first embodiment, the power converting apparatus 100 according to the first embodiment may have a configuration to perform synchronous rectification control by detecting a current flowing through a bus between the bridge circuit 3 and the smoothing capacitor 4 instead of the power supply current Is. In this case, because the current in a short-circuit path cannot be detected, the synchronous rectification control using a current threshold may shorten the period during which the synchronous rectification operation can be performed. Thus, in the case of performing the synchronous rectification control by detecting a bus current, control may be performed such that the switching element 321 or the switching element 322 is turned ON depending on the polarity even when the absolute value of the power supply current Is is smaller than the threshold during the operation with the short-circuit current as described above. In this case, the synchronous rectification operation can be performed for a long period; therefore, the conduction loss of the switching element 321 or the switching element 322 can be reduced.

Note that it is desirable that the first arm 31 be configured as a so-called 2-in-1 module in which the switching elements 311 and 312 are provided in one package. Similarly, it is desirable that the second arm 32 be configured as a 2-in-1 module in which the switching elements 321 and 322 are provided in one package. In a 2-in-1 module, two switching elements having the same switching characteristics are often mounted. When each of the first arm 31 and the second arm 32 is configured as a 2-in-1 module, the imbalance in heat generation between the switching element 311 and the switching element 312 is reduced and further, the imbalance in heat generation between the switching element 321 and the switching element 322 is reduced, as compared with the case where the switching elements 311, 312, 321, and 322 are each configured as one module.

As described above, according to the first embodiment, because an increase in the power supply voltage for the driving circuit 311DC can be prevented or reduced, a decrease in the withstand voltage of the driving circuit can be prevented or reduced, a decrease in the short circuit withstand of the switching element can be prevented or reduced, and further, the imbalance in heat generation between the switching element 311 and the switching element 312 can be reduced. As a result, the reliability of the power converting apparatus 100 can be improved. In addition, because an increase in the power supply voltage for the driving circuit 311DC can be prevented or reduced, an isolated power supply for improving a dielectric strength need not be additionally provided between the bootstrap circuit 401 and the driving circuit 311DC, the structure of the power converting apparatus 100 is simplified, and the manufacturing cost of the power converting apparatus 100 can be reduced. In addition, because the voltage of the direct-current voltage source 300 need not be reduced in order to prevent or reduce an increase in the capacitor voltage, the power supply voltage for the driving circuit 311DC can be adjusted to a value equal to the power supply voltage for the driving circuit 312DC while the power supply voltage with which the driving circuit 312DC can operate is ensured. Consequently, the imbalance in heat generation between the switching element 311 and the switching element 312 can be reduced, and the reliability of the power converting apparatus 100 is improved. In addition, because the power supply voltage for the driving circuit 311DC can be adjusted to a value equal to the power supply voltage for the driving circuit 312DC, the loss caused when one of the power supply voltages becomes higher than necessary during switching operations is reduced, the power consumption of the power converting apparatus 100 is reduced, and the efficiency of the power converting apparatus 100 can be improved. In addition, because an increase in the power supply voltage for the driving circuit 311DC can be prevented or reduced even when switching elements, such as WBG MOSFETs, with inferior forward current-forward voltage characteristics of the body diodes are used, the first embodiment is suitable for the power converting apparatus 100 including WBG MOSFETs, in particular, SiC MOSFETs. In addition, the first embodiment is suitable for the power converting apparatus 100 including switching elements, such as WBG switching elements, having characteristics sensitive to a gate driving voltage.

The sensitivity to the gate driving voltage will be explained. A conduction loss and a switching loss are used for performance indices of a SiC MOSFET. The conduction loss is determined by the ON-resistance and the current value of a MOSFET, and the ON-resistance is known to vary significantly depending on the gate driving voltage. Typically, the ON-resistance exhibits a tendency to rapidly increase when the gate driving voltage is low, and converges to a specific value as the gate driving voltage becomes higher. A semiconductor, however, has an element withstand voltage; therefore, the gate driving voltage cannot be increased unlimitedly. In such a case where the ON-resistance converges to a specific value when the gate driving voltage is 16 to 18 V, for example, the ON-resistance becomes twice the specific value when the gate driving voltage is reduced to 10 V. The change in the ON-resistance depending on the value of the gate driving voltage in this manner is referred to as sensitivity to the gate driving voltage in the present embodiment.

Second Embodiment

Figure 30:
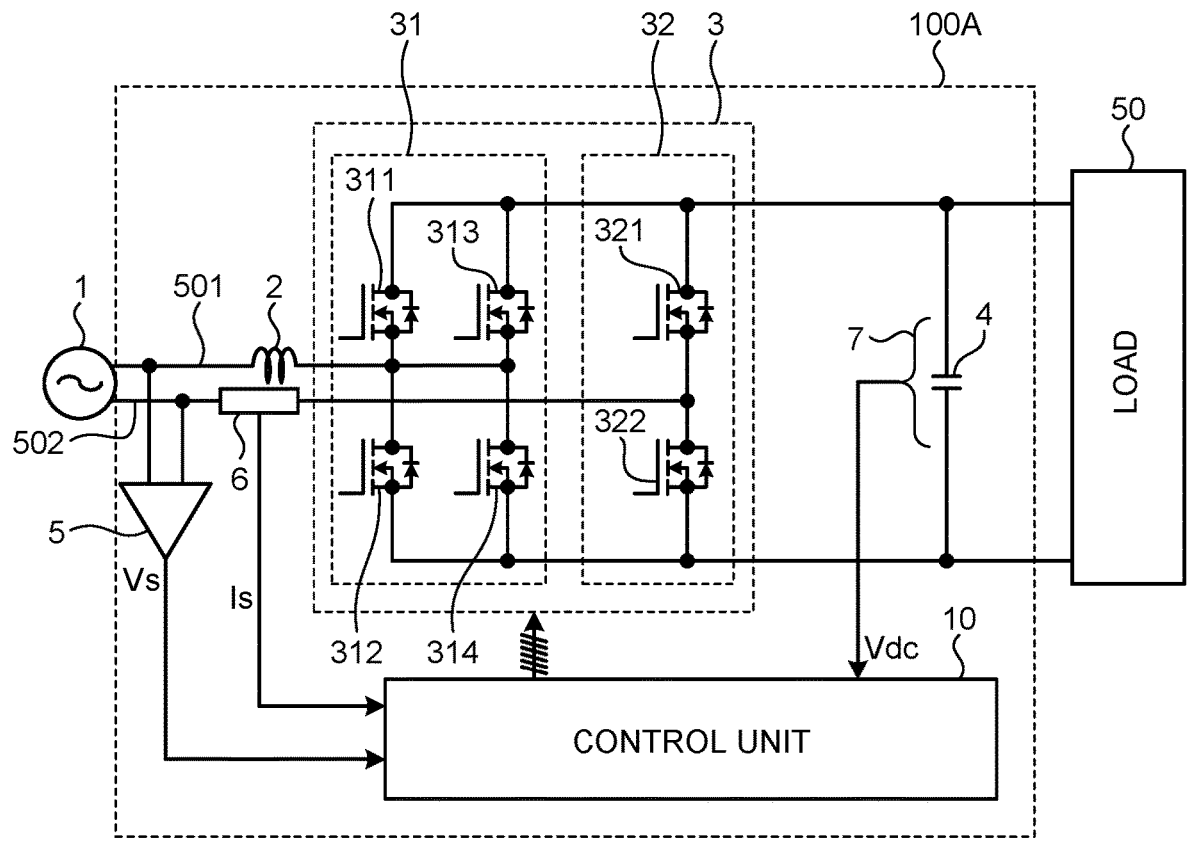
FIG. 30 is a diagram illustrating an example of a configuration of a power converting apparatus according to a second embodiment.

While a switching element pair constituted by two switching elements connected in series is provided in the first arm 31 in the first embodiment, a configuration in which n pairs of switching elements are connected in parallel in the first arm 31 and synchronous control is performed thereon will be described in a second embodiment. Here, n is an integer not smaller than 2. FIG. 30 is a diagram illustrating an example of a configuration of a power converting apparatus according to the second embodiment. In a power converting apparatus 100A according to the second embodiment, the first arm 31 includes a switching element 313 that is a fifth switching element and a switching element 314 that is a sixth switching element. The switching element 313 and the switching element 314 are connected in series. A switching element pair constituted by the switching element 313 and the switching element 314 is connected in parallel with the switching element pair constituted by the switching element 311 and the switching element 312. A reactor 2 is connected at a connection point of the switching element 313 and the switching element 314. FIG. 30 illustrates an example of a configuration in which synchronous control is performed by using two arms.

When driving the first arm 31 in which two pairs of switching elements are connected in parallel, the control unit 10 drives two switching elements 311 and 313 constituting an upper arm simultaneously and drives two switching elements 312 and 314 constituting a lower arm simultaneously, among the two pairs of switching elements. Note that simultaneously driving two switching elements connected in parallel with each other will be referred to as "parallel driving".

The parallel driving of two pairs of switching elements connected in parallel reduces the current flowing in each of the switching elements to half of that in the case of one pair of switching elements. As is clear from the characteristics in FIG. 19, as the current is smaller, the loss of the switching element is smaller, and the loss occurring in the first arm 31 is thus reduced. Consequently, the imbalance in heat generation between the first arm 31 and the second arm 32 can further be reduced.

While an example of the configuration in which two pairs of switching elements are connected in parallel is illustrated in FIG. 30, the number of pairs of switching elements is not limited to two, and may be n. In a case where the first arm 31 is constituted by n pairs of switching elements, the current flowing in one pair of switching elements is reduced to one n-th, and the loss in the first arm 31 can thus be further reduced. Note that the imbalance in loss among n pairs of switching elements connected in parallel need not be completely eliminated, and the number of pairs of switching elements to be connected in parallel may be selected within a range in which the imbalance in loss is permitted.

In addition, simultaneous driving of two switching elements connected in parallel in the first arm 31 is explained in the example of FIG. 30. Thus, in the second embodiment, a synchronous control method of simultaneously switching the switching elements connected in parallel is employed. The method of controlling the switching elements connected in parallel, however, is not limited thereto, and so-called interleaved control in which the phases of two switching elements connected in parallel are shifted by 180° from each other for control may be used.

In the interleaved control, the phases when the switching element 311 and the switching element 313 connected in parallel are turned ON are shifted by 180° from each other for control, and the phases when the switching element 312 and the switching element 314 connected in parallel are turned on are shifted by 180° from each other for control. As a result, the two switching elements connected in parallel are subjected to interleaved driving.

Interleaved driving of the first arm 31 facilitates driving at higher frequency, and enables reduction in size of the reactor 2 and reduction in the reactor loss. Note that, in a case of being frequently used in the passive state like the case with conditioners, the reactor 2 need not be reduced in size, and the configurations and operations of the first embodiment are more effective in terms of harmonic wave prevention and the power-supply power factor.

While one reactor 2 is provided between the alternating-current power supply 1 and the first arm 31 in the first and second embodiments, the configurations of the first and second embodiments are not limited thereto, and a reactor may also be provided between the alternating-current power supply 1 and the second arm 32. Use of two reactors in this manner can make the capacity of each reactor smaller, which improves the design freedom of the power converting apparatuses 100 and 100A as compared with a case where one reactor with a large capacity is used.

Figure 31:
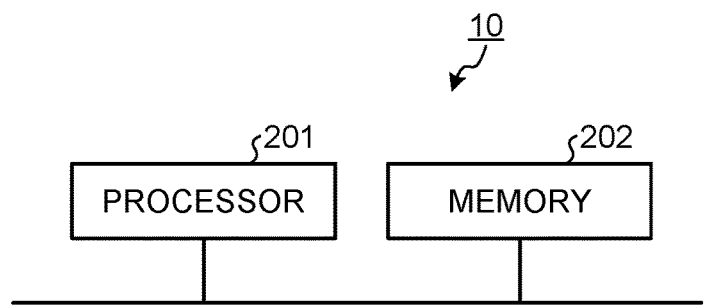
FIG. 31 is a diagram illustrating an example of a hardware configuration implementing the control unit of the first and second embodiments.

A hardware configuration of the control unit 10 of the power converting apparatuses 100 and 100A according to the first and second embodiments will now be described. FIG. 31 is a diagram illustrating an example of the hardware configuration for implementing the control unit of the first and second embodiments. The control unit 10 described in the first and second embodiments is implemented by a processor 201 and a memory 202.

The processor 201 is a central processing unit (CPU; also referred to as a central processing device, a processing device, a computing device, a microprocessor, a microcomputer, a processor, or a digital signal processor (DSP)), or a system large scale integration (LSI). The memory 202 is a semiconductor memory such as a random access memory (RAM), a read only memory (ROM), a flash memory, an erasable programmable read only memory (EPROM), or an electrically erasable programmable read only memory (EEPROM: registered trademark). The semiconductor memory may be a nonvolatile memory or may be a volatile memory. Alternatively, the memory 202 may be a magnetic disk, a flexible disk, an optical disk, a compact disk, a mini disc, or a digital versatile disc (DVD) instead of a semiconductor memory.

The power supply current command value control unit 21, the ON-duty control unit 22, the power supply voltage phase calculating unit 23, the first pulse generating unit 24, the second pulse generating unit 25, the current command value calculating unit 26, and the instantaneous value command value calculating unit 27 illustrated in FIG. 13 are implemented by the processor 201 and the memory 202 illustrated in FIG. 31. Specifically, the respective units are implemented by the processor 201 by storing programs for operating as each of the power supply current command value control unit 21, the ON-duty control unit 22, the power supply voltage phase calculating unit 23, the first pulse generating unit 24, the second pulse generating unit 25, the current command value calculating unit 26, and the instantaneous value command value calculating unit 27 in the memory 202 and reading and executing the programs stored in the memory 202.

Third Embodiment

Figure 32:
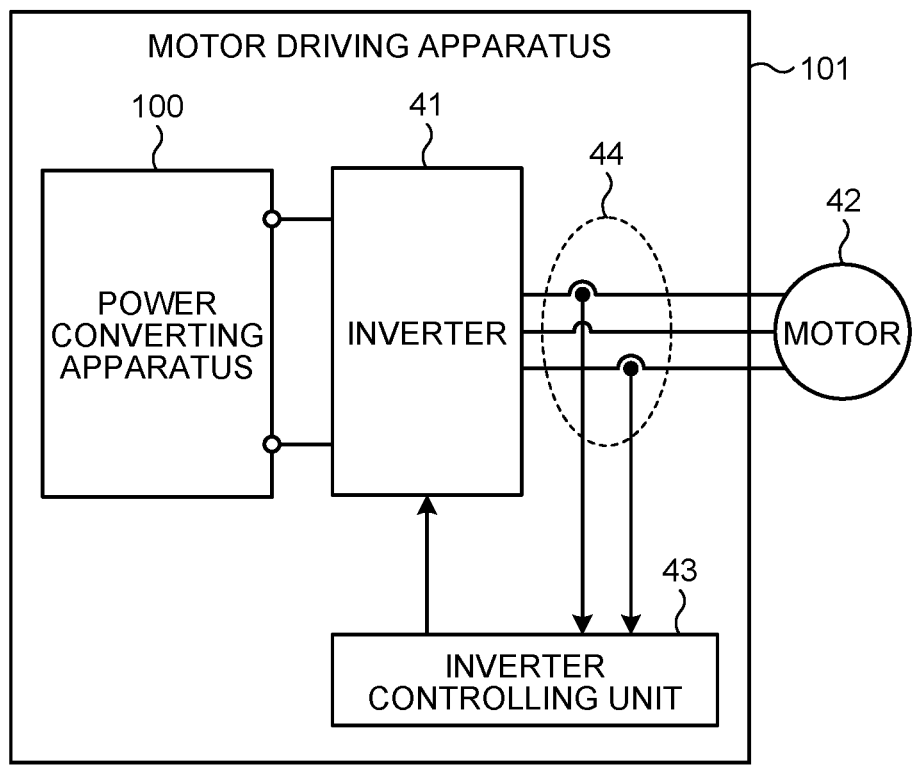
FIG. 32 is a diagram illustrating an example of a configuration of a motor driving apparatus according to a third embodiment.

FIG. 32 is a diagram illustrating an example of a configuration of a motor driving apparatus according to a third embodiment. A motor driving apparatus 101 according to a third embodiment drives a motor 42 that is a load. The motor driving apparatus 101 includes the power converting apparatus 100 of the first embodiment, an inverter 41, a motor current detecting unit 44, and an inverter controlling unit 43. The inverter 41 drives the motor 42 by converting a direct-current power supplied from the power converting apparatus 100 into an alternating-current power and outputting the alternating-current power to the motor 42.

Note that the motor driving apparatus 101 may include the power converting apparatus 100A of the second embodiment instead of the power converting apparatus 100 of the first embodiment. In addition, while the load of the motor driving apparatus 101, that is, the device connected to the inverter 41 is the motor 42 in the third embodiment, the device connected to the inverter 41 may be any device, other than the motor 42, to which an alternating-current power is input.

The inverter 41 is a circuit including switching elements, including insulated gate bipolar transistors (IGBTs), in a three-phase bridge configuration or a two-phase bridge configuration. The switching elements included in the inverter 41 are not limited to IGBTs, but may be switching elements made of WBG semiconductors, insulated gate controlled thyristors (IGCTs), field effect transistors (FETs) or MOSFETs.

The motor current detecting unit 44 detects a current flowing between the inverter 41 and the motor 42. The inverter controlling unit 43 generates PWM signals for driving the switching elements in the inverter 41 by using a current detected by the motor current detecting unit 44 such that the motor 42 rotates at a rotating speed, and outputs the generated PWM signals to the inverter 41. The inverter controlling unit 43 is implemented by a processor and a memory in a manner similar to the control unit 10. Note that the inverter controlling unit 43 of the motor driving apparatus 101 and the control unit 10 of the power converting apparatus 100 may be implemented by one circuit.

In a case where the power converting apparatus 100 or 100A according to the first or second embodiment is used in the motor driving apparatus 101, the bus voltage Vdc necessary for controlling the bridge circuit 3 illustrated in FIG. 1 and FIG. 30 changes depending on the operation state of the motor 42. Typically, as the rotating speed of the motor 42 is higher, the voltage output from the inverter 41 need to be higher. The upper limit of the voltage output from the inverter 41 is limited by a voltage input to the inverter 41, that is, the bus voltage Vdc that is output from the power converting apparatus 100 or 100A. A region in which the voltage output from the inverter 41 exceeds the upper limit limited by the bus voltage Vdc and saturated is called an overmodulation region.

In the motor driving apparatus 101 as described above, the bus voltage Vdc need not be increased in a low rotation range of the motor 42, that is, in a range in which the overmodulation region is not reached. In contrast, when the motor 42 rotates at high speed, the overmodulation region can be shifted toward higher rotation by increasing the bus voltage Vdc. As a result, the operation range of the motor 42 can be expanded toward higher rotation.

In addition, when the operation range of the motor 42 need not be expanded, the number of coil turns around a stator of the motor 42 can be increased by a corresponding amount. In the low rotation region, the increase in the number of coil turns makes the motor voltage generated across the coil ends higher and lowers the current flowing in the coil accordingly, which reduces the loss caused by the switching operation of the switching elements in the inverter 41. For producing both effects of expansion of the operation range of the motor 42 and improvement in the loss in the low rotation region, the number of coil turns of the motor 42 is set to an appropriate value.

According to the third embodiment, because the power converting apparatus 100 or 100A according to the first or second embodiment is used, the effect of improving the reliability of the motor driving apparatus 101 is produced. In addition, because an increase in the temperature of the motor driving apparatus 101 is prevented or reduced as a result of applying switching elements made of WBG semiconductors to the power converting apparatus 100 or 100A according to the first or second embodiment, the capacity of cooling the components mounted on the motor driving apparatus 101 can be ensured even when the motor driving apparatus 101 is reduced in size. In addition, high-frequency driving of switching elements made of WBG semiconductors enables reduction in size and loss of the reactor 2. Thus, as a result of applying switching elements made of WBG semiconductors to the power converting apparatus 100 or 100A according to the first or second embodiment, an increase in weight of the motor driving apparatus 101 can be prevented or reduced.

Fourth Embodiment

Figure 33:
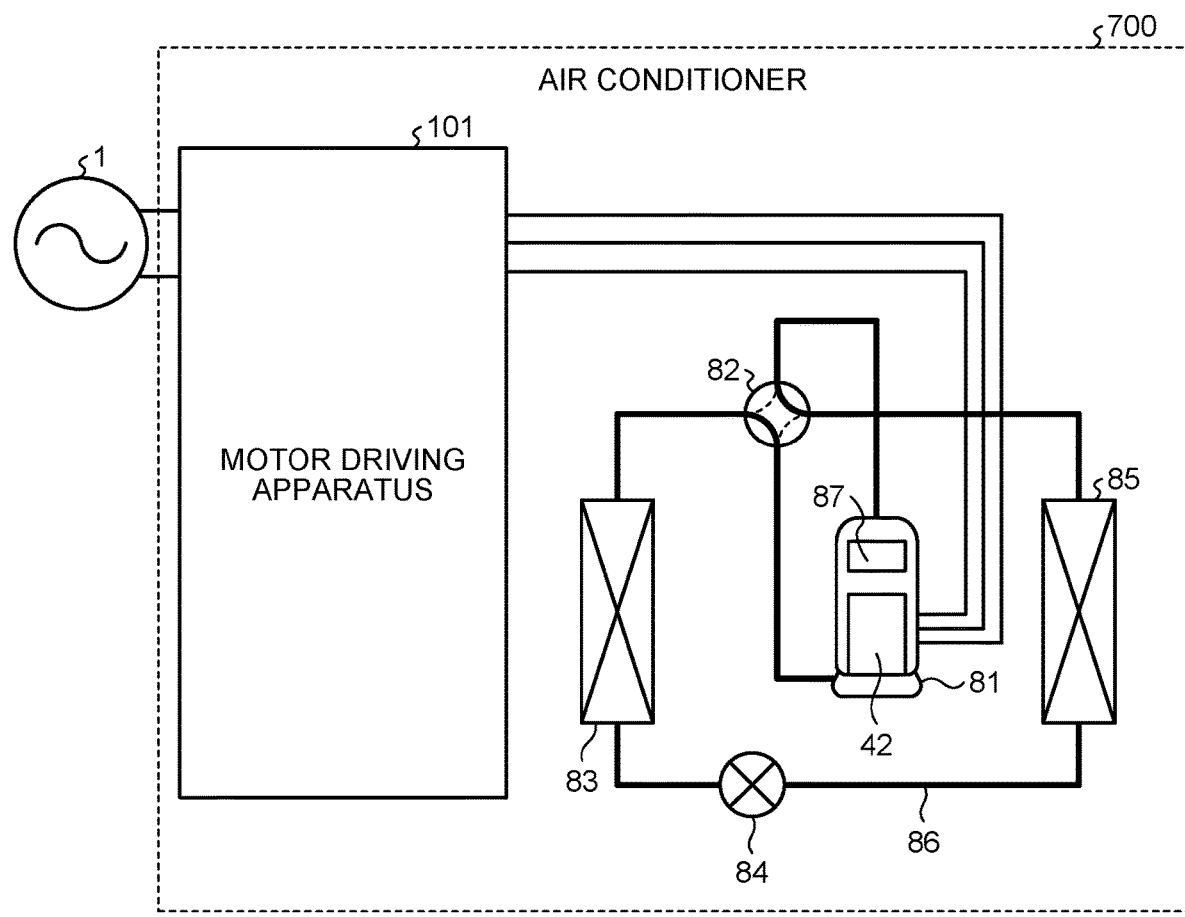
FIG. 33 is a diagram illustrating an example of a configuration of an air conditioner according to a fourth embodiment.

FIG. 33 is a diagram illustrating an example of a configuration of an air conditioner according to a fourth embodiment. An air conditioner 700 according to the fourth embodiment is an example of a refrigeration cycle system, and includes the motor driving apparatus 101 according to the third embodiment, and a motor 42. The air conditioner 700 also includes a compressor 81, a four-way valve 82, an outdoor heat exchanger 83, an expansion valve 84, an indoor heat exchanger 85, and refrigerant piping 86.

The air conditioner 700 may be a split air conditioner in which an outdoor unit is separated from an indoor unit, or may be an integrated air conditioner in which the compressor 81, the indoor heat exchanger 85, and the outdoor heat exchanger 83 are arranged in one housing.

The compressor 81 includes therein a compression mechanism 87 for compressing the refrigerant, and a motor 42 for causing the compression mechanism 87 to operate. The motor 42 is driven by the motor driving apparatus 101. In the air conditioner 700, a refrigeration cycle is constituted by circulation of refrigerant through the compressor 81, the four-way valve 82, the outdoor heat exchanger 83, the expansion valve 84, the indoor heat exchanger 85, and the refrigerant piping 86.

Note that the components of the air conditioner 700 can also be applied to such equipment as a refrigerator or a freezer including a refrigeration cycle. In addition, while the motor 42 is used for a driving source of the compressor 81 in the fourth embodiment, the motor 42 may be used as a driving source for driving each of an indoor unit fan and an outdoor unit fan, which are not illustrated, instead of the compressor 81. Alternatively, the motor 42 may be applied to a driving source for each of the indoor unit fan, the outdoor unit fan, and the compressor 81, and the three motors 42 may be driven by the motor driving apparatus 101.

In addition, because the operation of the air conditioner 700 under an intermediate condition in which the power output is equal to or lower than half of a rated power output, that is the operation of the air conditioner 700 in a low power output range is dominant throughout the year, the contribution to the annual power consumption under the intermediate condition is high. In addition, in the air conditioner 700, the rotating speed of the motor 42 tends to be low, and the bus voltage required for driving the motor 42 tends to be low. Thus, operation of the switching elements used in the air conditioner 700 in a passive state is effective in terms of system efficiency. The power converting apparatus 100 capable of reducing the loss in a wide range of operation modes from the passive state to the high-frequency switching state is therefore useful for the air conditioner 700. Although the reactor 2 can be reduced in size with the interleaved control as described above, the frequency of operation of the air conditioner 700 under the intermediate condition is high and thus the reactor 2 need not be reduced in size; therefore, the configurations and operations of the power converting apparatus 100 or 100A according to the first or second embodiment are more effective in terms of harmonic wave prevention and the power-supply power factor.

In addition, as described above, because the switching loss in the case where switching elements made of WBG semiconductors are driven at a high switching frequency equal to or higher than 10 kHz is smaller than that of switching elements made of Si semiconductors, application of switching elements made of WBG semiconductors to the power converting apparatus 100 or 100A according to the first or second embodiment prevents or reduces an increase in temperature of the motor driving apparatus 101. As a result, the capacity of cooling the components mounted on the motor driving apparatus 101 can be ensured even when the outdoor unit fan is reduced in size. The power converting apparatus 100 or 100A according to the first or second embodiment is therefore suitable for use in the air conditioner 700 that is highly efficient and has a high power equal to or higher than 4.0 kW.

In addition, switching elements made of WBG semiconductors can be driven at higher frequency than switching elements made of Si semiconductors. Thus, high-frequency driving enables reduction in size and in loss of the reactor 2. Thus, as a result of applying switching elements made of WBG semiconductors to the power converting apparatus 100 or 100A according to the first or second embodiment, an increase in weight of the air conditioner 700 can be prevented or reduced.

In addition, according to the fourth embodiment, high-frequency driving of the switching elements reduces the switching loss, and the air conditioner 700 with a low energy consumption rate and high efficiency can thus be achieved.

The configurations presented in the embodiments above are examples of the present invention, and can be combined with other known technologies or can be partly omitted or modified without departing from the scope of the present invention.

REFERENCE SIGNS LIST

1 single-phase alternating-current power supply; 2 reactor; 3 bridge circuit; 4 smoothing capacitor; 5 power supply voltage detecting unit; 6 power supply current detecting unit; 7 bus voltage detecting unit; 10 control unit; 11, 311, 312, 313, 314, 321, 322 switching element; 21 power supply current command value control unit; 22 on-duty control unit; 23 power supply voltage phase calculating unit; 24 first pulse generating unit; 25 second pulse generating unit; 26 current command value calculating unit; 27 instantaneous value command value calculating unit; 31 first arm; 32 second arm; 41 inverter; 42 motor; 43 inverter controlling unit; 44 motor current detecting unit; 50 load; 81 compressor; 82 four-way valve; 83 outdoor heat exchanger; 84 expansion valve; 85 indoor heat exchanger; 86 refrigerant piping; 87 compression mechanism; 100, 100-1, 100-2, 100-3, 100A power converting apparatus; 101 motor driving apparatus; 201 processor; 202 memory; 241 carrier generating unit; 242 reference PWM generating unit; 243 dead time generating unit; 244 pulse selector; 300 direct-current voltage source; 311C, 321C boot capacitor; 311D, 321D boot diode; 311D', 312RD, 321D', 322RD gate voltage suppression diode; 311DC, 312DC, 321DC, 322DC driving circuit; 311R, 321R boot resistor; 311a, 312a, 321a, 322a body diode; 312BD body diode voltage; 401, 401A, 402, 402A bootstrap circuit; 501 first line; 502 second line; 503 third line; 504 fourth line; 506 first connection point; 508 second connection point; 600 semiconductor substrate; 601, 603 region; 602 insulating oxide layer; 604 channel; 700 air conditioner.

The invention claimed is:

1. A power converting apparatus for converting an alternating-current power supplied from an alternating-current power supply into a direct-current power, the power converting apparatus comprising:
a first line and a second line, each of the first line and the second line being connected to the alternating-current power supply;
a first reactor disposed on the first line;
a first arm comprising a first switching element, a second switching element, and a third line having a first connection point, the first switching element being connected to the second switching element in series by the third line, the first connection point being connected to the first reactor by the first line;
a second arm connected in parallel with the first arm and comprising a third switching element, a fourth switching element, and a fourth line having a second connection point, the third switching element being connected to the fourth switching element in series by the fourth line, the second connection point being connected to the alternating-current power supply by the second line;
a first capacitor connected in parallel with the second arm;
a first driving circuit outputting a first driving signal for driving the first switching element;
a bootstrap circuit comprising a second capacitor, the second capacitor applying a power supply voltage to the first driving circuit; and
a diode adjusting the power supply voltage,
wherein a first voltage is lower than a second voltage, the first voltage being a voltage at which a forward current starts to flow in the diode, the second voltage being a voltage at which a forward current starts to flow in a body diode formed in the second switching element, and
wherein the diode adjusting the power supply voltage is provided between the second capacitor and the first driving circuit.

2. The power converting apparatus according to claim 1, further comprising a second driving circuit outputting a second driving signal for driving the second switching element,
wherein the first voltage is set to a value at which a voltage of the first driving signal is equal to a voltage of the second driving signal.

3. The power converting apparatus according to claim 1, wherein a switching frequency of the first arm is higher than a switching frequency of the second arm.

4. The power converting apparatus according to claim 3, wherein the switching frequency of the first arm is higher than 266 times of a frequency of the alternating-current power supply.

5. The power converting apparatus according to claim 3, wherein the switching frequency of the first arm is higher than 16 kHz.

6. The power converting apparatus according to claim 1, wherein the first switching element and the second switching element are made of wide band gap semiconductor.

7. The power converting apparatus according to claim 6, wherein the wide band gap semiconductor is silicon carbide or gallium nitride material.

8. The power converting apparatus according to claim 6, wherein the third switching element and the fourth switching element are made of silicon carbide semiconductor.

9. The power converting apparatus according to claim 6, wherein the third switching element and the fourth switching element are super junction metal-oxide-semiconductor field-effect transistors.

10. The power converting apparatus according to claim 1, wherein
at least one of the first arm and the second arm is configured as a 2-in-1 module.

11. The power converting apparatus according to claim 1, further comprising a current detecting unit detecting a power supply current output from the alternating-current power supply,
wherein whether or not to permit the third switching element and the fourth switching element to be ON is determined depending on the power supply current.

12. The power converting apparatus according to claim 11,
wherein when the power supply current is equal to or smaller than a threshold, the first switching element and the second switching element are not permitted to be ON, and
wherein when the power supply current is larger than the threshold, the first switching element and the second switching element are permitted to be ON.

13. The power converting apparatus according to claim 11,
wherein when the power supply current is equal to or smaller than a threshold, the third switching element and the fourth switching element are not permitted to be ON, and
wherein when the power supply current is larger than the threshold, the third switching element and the fourth switching element are permitted to be ON.

14. The power converting apparatus according to claim 1, wherein the first arm includes a fifth switching element and a sixth switching element, the fifth switching element being connected in series to the sixth switching element,
wherein the fifth switching element is connected in parallel with the first switching element, and
wherein the sixth switching element is connected in parallel with the second switching element.

15. The power converting apparatus according to claim 14,
wherein the first switching element and the fifth switching element are driven simultaneously, and
wherein the second switching element and the sixth switching element are driven simultaneously.

16. A motor driving apparatus for driving a motor, the motor driving apparatus comprising:
the power converting apparatus according to claim 1; and
an inverter converting a direct-current power output from the power converting apparatus into an alternating-current power, and outputting the alternating-current power to the motor.

17. An air conditioner comprising:
the motor; and
the motor driving apparatus according to claim 16.

18. The air conditioner according to claim 17,
further comprising a fan driven by the motor.

19. The air conditioner according to claim 17,
further comprising a compressor driven by the motor.

20. A power converting apparatus for converting an alternating-current power supplied from an alternating-current power supply into a direct-current power, the power converting apparatus comprising:
a first line and a second line, each of the first line and the second line being connected to the alternating-current power supply;
a first reactor disposed on the first line;
a first arm comprising a first switching element, a second switching element, and a third line having a first connection point, the first switching element being connected to the second switching element in series by the third line, the first connection point being connected to the first reactor by the first line;
a second arm connected in parallel with the first arm and comprising a third switching element, a fourth switching element, and a fourth line having a second connection point, the third switching element being connected to the fourth switching element in series by the fourth line, the second connection point being connected to the alternating-current power supply by the second line;
a first capacitor connected in parallel with the second arm;
a first driving circuit outputting a first driving signal for driving the first switching element;
a bootstrap circuit comprising a second capacitor, the second capacitor applying a power supply voltage to the first driving circuit; and
a diode adjusting the power supply voltage,
wherein a first voltage is lower than a second voltage, the first voltage being a voltage at which a forward current starts to flow in the diode, the second voltage being a voltage at which a forward current starts to flow in a body diode formed in the second switching element, and
wherein the diode adjusting the power supply voltage is connected in parallel with the second switching element.

21. A motor driving apparatus for driving a motor, the motor driving apparatus comprising:
the power converting apparatus according to claim 20; and
an inverter converting a direct-current power output from the power converting apparatus into an alternating-current power, and outputting the alternating-current power to the motor.

22. An air conditioner comprising:
the motor; and
the motor driving apparatus according to claim 21.

* * * * *